United States Patent
Miyazawa et al.

(10) Patent No.: US 7,216,962 B2
(45) Date of Patent: May 15, 2007

(54) INK JET RECORDING HEAD AND INK JET PRINTER WITH PIEZOELECTRIC ELEMENT

(75) Inventors: Hiromu Miyazawa, Toyoshina-machi (JP); Takamitsu Higuchi, Matsumoto (JP); Setsuya Iwashita, Nirasaki (JP)

(73) Assignee: Seiko Epson Corporation, Tokyo (JP)

( * ) Notice: Subject to any disclaimer, the term of this patent is extended or adjusted under 35 U.S.C. 154(b) by 252 days.

(21) Appl. No.: 10/866,721

(22) Filed: Jun. 15, 2004

(65) Prior Publication Data

US 2005/0018019 A1    Jan. 27, 2005

(30) Foreign Application Priority Data

Jun. 25, 2003    (JP)    .............................. 2003-181153
Sep. 1, 2003    (JP)    .............................. 2003-308967

(51) Int. Cl.
*B41J 2/045*    (2006.01)

(52) U.S. Cl. ...................................................... 347/68
(58) Field of Classification Search .................. 347/68, 347/70–72; 310/326
See application file for complete search history.

(56) References Cited

FOREIGN PATENT DOCUMENTS

JP    A 2001-223404    8/2001

OTHER PUBLICATIONS

Wang et al. "Epitaxial BiFeO, Multiferroic Thin Film Heterostructures," Science, vol. 299, Mar. 14, 2003, pp. 1719-1722.

*Primary Examiner*—An H. Do
(74) *Attorney, Agent, or Firm*—Oliff & Berridge, PLC

(57) ABSTRACT

A piezoelectric element includes a piezoelectric material film made of $BiFeO_3$. The piezoelectric element can be used in an ink jet recording head which includes a cavity with a variable internal volume, wherein the internal volume of the cavity changes depending on deformation of the piezoelectric material film included in the piezoelectric element.

27 Claims, 15 Drawing Sheets

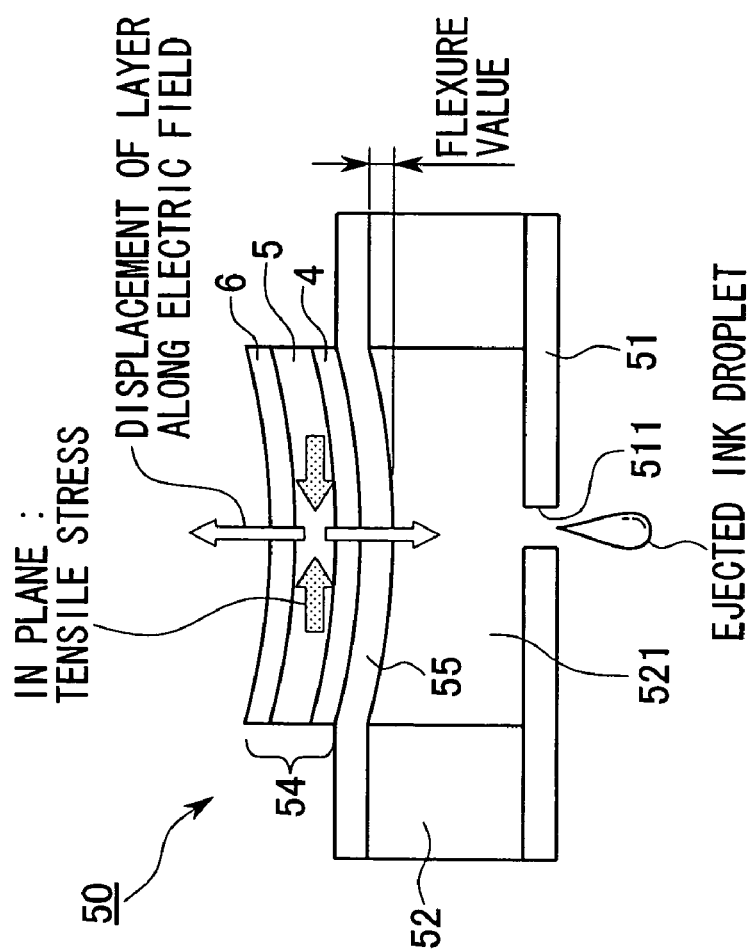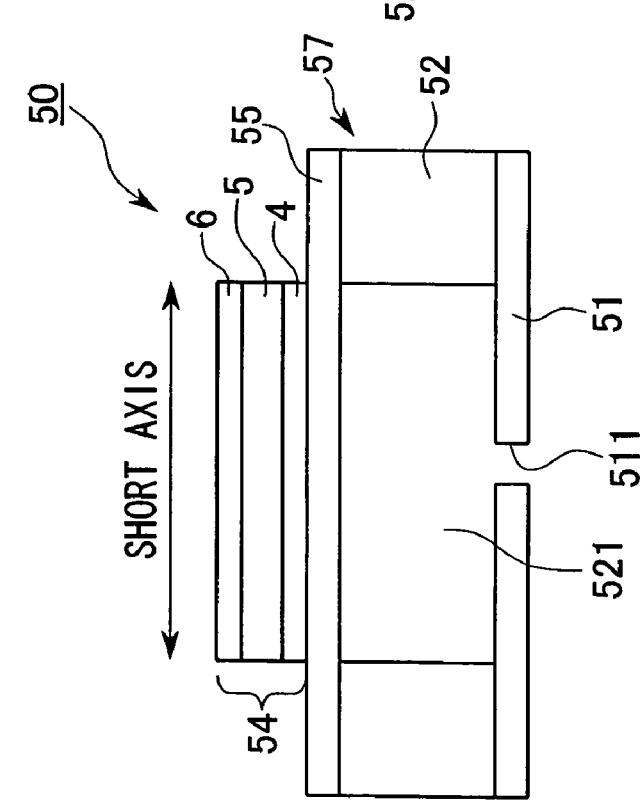

INK JET RECORDING HEAD AND INK JET PRINTER WITH PIEZOELECTRIC ELEMENT

BACKGROUND OF THE INVENTION

1. Field of the Invention

This invention relates to a piezoelectric element including a $BiFeO_3$ piezoelectric film, an ink jet recording head, an ink jet printer, a surface acoustic wave element, a frequency-dependent filter, an oscillator, an electronic circuit, a thin film piezoelectric resonator and an electronic apparatus.

Priority is claimed on Japanese Patent Application No. 2003-181153, filed Jun. 25, 2003, and Japanese Patent Application No. 2003-308967, filed Sep. 1, 2003, the contents of which are incorporated herein by reference.

2. Description of Related Art

An ink jet printer is known as a high-resolution and high speed printing printer. The ink jet printer is provided with an ink jet recording head which comprises a cavity with a variable internal volume, and, in the ink jet printer, printing is carried out by ejecting ink droplets from nozzles while the head scans. A piezoelectric element made of ceramic as represented by PZT ($Pb(Zr_xTi_{1-x})O_3$) is conventionally used as a head actuator in the ink jet recording head for such an ink jet printer (see, e.g., Japanese Unexamined Patent Application, First Publication No. 2001-223404).

It has been confirmed in recent reports that $BiFeO_3$ as a ferroelectric material has a high ferroelectric characteristic of dielectric polarization moment Pr of 60 to 70 $\mu C/cm^2$ (see, e.g., Science, Vol. 299, 1719–1721, 2003). For this reason, $BiFeO_3$ is a good piezoelectric material and $BiFeO_3$ is anticipated to be used. In this report, upper and lower electrodes between which a ferroelectric layer is sandwiched are made of $SrRuO_3$, and the ferroelectric layer made of $BiFeO_3$ has a perovskite structure in a tetragonal system. Characteristics of a surface acoustic wave element, a frequency filter, an oscillator, an electronic circuit, and the like are expected to be improved, and therefore this new piezoelectric material is anticipated to be employed therein.

SUMMARY OF THE INVENTION

Further high quality and high speed has been required in ink jet printers. In order to respond to these requirements, a technique for highly densifying the nozzle in an ink jet recording head has become necessary, and therefore, it is necessary for a piezoelectric element (head actuator) deposited on a cavity to be improved. In addition, especially regarding the piezoelectric element made of PZT, since it includes Pb as a constituent and the evaporation of Pb leads to deterioration of the environment because Pb is harmful, manufacturing the piezoelectric element made of this material must reconsidered.

Regarding the improvement of the piezoelectric element, it is thought to be effective for the manufacture of the piezoelectric element to be able to use thin film processes. It is thought that this is because the thin film processes can be applied to a more miniaturized ink cavity in the next generation.

$BiFeO_3$ is thought to be a very promising candidate for a piezoelectric material because it has a high piezoelectric characteristic, and does not contain Pb that is detrimental to the environment; however, its application is not described in the report described above (Science, Vol. 299, 1719–1721, 2003).

In the case in which an attempt is made to manufacture a piezoelectric element used in the recording head for the ink jet printer using a piezoelectric material film of this $BiFeO_3$, there is a problem in that the manufacture is not successful because it is very difficult to directly use $BiFeO_3$ on a Si substrate. This is because a natural oxide film normally forms on the Si substrate, and it is difficult to make a $BiFeO_3$ film grow epitaxially on the natural oxide film, and, for this reason, a piezoelectric material film made of $BiFeO_3$ cannot be formed on the Si substrate.

In view of these circumstances, the object of the present invention is to provide a piezoelectric element which has a high performance and does not include Pb, and is formed by thin film processes including the direct implementation on a Si substrate, and an ink jet recording head, an ink jet printer, a surface acoustic wave element, a frequency-dependent filter, an oscillator, an electronic circuit, a thin film piezoelectric resonator and an electronic apparatus, in which the piezoelectric element is used.

In order to attain the above object, the piezoelectric element of the present invention includes a piezoelectric material film made of $BiFeO_3$.

This piezoelectric element has a high performance and is environmentally preferable because the piezoelectric material film made of $BiFeO_3$ has a good piezoelectric characteristic and does not include Pb that is detrimental to the environment.

In the piezoelectric element, it is preferable that, in an ink jet recording head which includes a cavity with a variable internal volume, the internal volume of the cavity change depending on deformation of the piezoelectric material film.

In this piezoelectric element (head actuator) for the ink jet recording head, an ink is ejected suitably because of the good piezoelectric characteristic and is environmentally preferable, as described above.

In the piezoelectric element, it is preferable that the piezoelectric material film have a rhombohedral structure in a pseudo-cubic system with a (100)-orientation. In this case, the piezoelectric element preferably includes a buffer layer formed on a substrate using an ion beam assist deposition method, a lower electrode made of a perovskite-type material formed on the buffer layer, the piezoelectric material film made of $BiFeO_3$ with a rhombohedral structure in a pseudo-cubic system with a (100)-orientation, and an upper electrode formed on the piezoelectric material film.

According to this piezoelectric element, even for the case in which a Si substrate is used as a base substance, a piezoelectric material film made of a $BiFeO_3$ can be directly mounted onto the natural oxide on the Si substrate; therefore, the film processes can be adopted on manufacturing, and, accordingly, the miniaturization such as high densification of the nozzle can be realized because the lower electrode and the piezoelectric material film made of $BiFeO_3$ are stacked through the intervention of the buffer layer formed using an ion beam assist deposition method.

In the piezoelectric element, the lower electrode made of a perovskite-type material is preferably epitaxially grown with a (100)-orientation.

According to this piezoelectric element, the piezoelectric material film made of $BiFeO_3$, which has a rhombohedral structure in a pseudo-cubic system with a (100)-orientation, can grow epitaxially with high quality on this lower electrode.

In the piezoelectric element, the lower electrode made of a perovskite material is preferably made of at least one of $SrRuO_3$, Nb—$SrTiO_3$, La—$SrTiO_3$, and $(La, Sr)CoO_3$.

According to this piezoelectric element, $BiFeO_3$ with a rhombohedral structure in a pseudo-cubic system with a (100)-orientation can grow epitaxially with high quality on this lower electrode.

In the piezoelectric element, it is preferable that the piezoelectric material film have a tetragonal structure in a pseudo-cubic system with a (111)-orientation. In this case, it is preferable that the piezoelectric element include a buffer layer formed on a substrate, a lower electrode formed on the buffer layer, the piezoelectric material film made of $BiFeO_3$ with a tetragonal structure in a pseudo-cubic system with a (111)-orientation, and an upper electrode formed on the piezoelectric material film.

According to this piezoelectric element, even for the case in which a Si substrate is used as a base substance, a piezoelectric material film made of a $BiFeO_3$ can be directly mounted onto the natural oxide on the Si substrate, and therefore, the film processes can be adopted on manufacturing and, for this reason, the miniaturization such as high densification of the nozzle can be realized, because the lower electrode and the piezoelectric material film made of $BiFeO_3$ are stacked through the intervention of the buffer layer.

In the piezoelectric element, it is preferable that the lower electrode be formed of Pt with a (111)-orientation.

According to this piezoelectric element, a Pt film grows with a (111)-orientation regardless of a kind of a film formation method used, and therefore, the lower electrode can be easily formed, for example, using a rather simpler method such as sputtering.

In the piezoelectric element, it is preferable that the lower electrode have a perovskite structure in a pseudo-cubic system with a (111)-orientation.

According to this piezoelectric element, a (111)-oriented $BiFeO_3$ layer in a pseudo-cubic system with a tetragonal structure can grow epitaxially with good quality on the lower electrode.

In the piezoelectric element, it is preferable that the lower electrode be made of at least one selected from $SrRuO_3$, $Nb—SrTiO_3$, $La—SrTiO_3$, and $(La, Sr)CoO_3$.

According to this piezoelectric element, a (111)-oriented $BiFeO_3$ layer in a pseudo-cubic system with a tetragonal structure can grow epitaxially with good quality on the lower electrode.

In the piezoelectric element, it is preferable that the piezoelectric material film made of $BiFeO_3$ have a perovskite structure, in which some Fe atoms located at B-sites in the structure are substituted by magnetic metal atoms. In this case, it is preferable that the magnetic metal atoms be at least one selected from the group of Mn, Ru, Co, and Ni.

According to this piezoelectric element, the magnetism of the piezoelectric material film made of $BiFeO_3$ is strengthened and its dielectric characteristic improves, which results in higher performance of the ferroelectric memory device.

In the piezoelectric element, it is preferable that the magnetic metal atoms be substituted for 1 to 10% of Fe atoms located at all of the B-sites in the piezoelectric material film made of $BiFeO_3$.

In the case of less than 1%, the substitution cannot improve the magnetism sufficiently, and in the case of more than 10%, it is cannot be expected that the substitution can improve the magnetism more than that of the case of less than 10%.

In the piezoelectric element, it is preferable that the piezoelectric material film made of $BiFeO_3$ have a perovskite structure, in which some Fe atoms located at B-sites are substituted by metal atoms whose valencies are higher than that of Fe. In this piezoelectric element, it is preferable that the metal atoms whose valencies are higher than that of Fe be at least one selected from the group of V, Nb, Ta, W, Ti, Zr, and Hf.

In the perovskite structure of $BiFeO_3$, Bi atoms located at A-sites in the structure evaporate easily and accordingly defects occur at the A-sites. In a $BiFeO_3$ crystal in which there are defects of missing Bi atoms at A-sites in the structure, a current leaks easily through this crystal because the $BiFeO_3$ crystal is no longer electrically neutral and no longer electrically insulated. According to this ferroelectric memory device, since some Fe atoms located at B-sites are substituted by metal atoms whose valencies are higher than that of Fe, the $BiFeO_3$ crystal can be maintained neutral and insulated in the entire crystal, which results in the prevention of current leakage.

In the piezoelectric element, it is preferable that the metal atoms whose valencies are higher than Fe be substituted for 1 to 30% of Fe atoms located at all of the B-sites in the piezoelectric material film made of $BiFeO_3$.

In the case of less than 1%, the substitution cannot sufficiently improve the prevention of the current leakage, and in the case of more than 30%, it cannot be expected that the substitution can improve the prevention of the current leakage more than that of the case of less than 30%.

The ink jet recording head of the present invention with a cavity with a variable internal volume includes the piezoelectric material film in which the internal volume of the cavity changes depending on deformation of the piezoelectric material film.

In this ink jet recording head, an ink can be ejected suitably because of the good piezoelectric characteristic, as described above, and this ink jet recording head has a high performance and is environmentally preferable because it has an environmentally preferable piezoelectric material film without Pb.

An ink jet printer of the present invention includes an ink jet recording head described above.

Since this ink jet printer has the ink jet recording head which has a high performance and is environmentally preferable, this ink jet printer itself has a high performance and is environmentally preferable.

A surface acoustic wave element of the present invention includes a piezoelectric element which is formed on a substrate through the intervention of a buffer layer, wherein a piezoelectric material film provided in the piezoelectric element is made of $BiFeO_3$ and has a rhombohedral structure in a pseudo-cubic system with a (100)-orientation.

Since the piezoelectric element described above is formed on the substrate through the intervention of the buffer layer in this surface acoustic wave element, the piezoelectric material film provided in the piezoelectric element is made of $BiFeO_3$ and has a rhombohedral structure in a pseudo-cubic system with a (100)-orientation, this surface acoustic wave element itself has a high performance. In addition, since semiconductor devices can be formed in a single crystal substrate, the semiconductor devices can be integrated thereto, and in this case, since the buffer layer has a function which prevents the leakage of surface acoustic waves to the single crystal substrate, the characteristics of the surface acoustic wave element are maintained suitably.

In the surface acoustic wave element, it is preferable that a conductive film be provided between the buffer layer and the piezoelectric material film.

According to this surface acoustic wave element, in the case in which the buffer layer is made of a material which is not suitable for the piezoelectric material film to grow directly on this buffer layer with an orientation, the piezoelectric material film can be formed with a good orientation because of the intervention of the conductive film. Accordingly, a material having a large electromechanical coupling coefficient can be selected, and thereby, the surface acoustic wave element itself has a high performance.

The frequency-dependent filter or frequency filter of the present invention includes first electrodes formed on the piezoelectric material film provided in the surface acoustic wave element described above, and second electrodes formed on the piezoelectric material film, which output electrical signals resonating specified frequencies or specified-band frequencies of surface acoustic waves generated in the piezoelectric material film due to electrical signals applied to the first electrodes.

According to this frequency filter, the piezoelectric material film has better piezoelectric characteristics, and therefore, this piezoelectric material film has a large electromechanical coupling coefficient, thereby the specific band width is sufficiently broad.

The oscillator of the present invention has an oscillating circuit which includes electrodes for applying electrical signals, which are formed on the piezoelectric material film provided in the surface acoustic wave element described above and which generates surface acoustic waves in the piezoelectric material film due to electrical signals applied, electrodes for resonating, which are formed on the piezoelectric material film and which resonates specified frequencies or specified-band frequencies of surface acoustic waves generated in the piezoelectric material film due to electrical signals applied to the electrodes for applying electrical signals, and at least a transistor.

According to this oscillator, the piezoelectric material film has better piezoelectric characteristics, and therefore, this piezoelectric material film has a large electromechanical coupling coefficient, and thereby an extension coil can be omitted, and an oscillator with a simple constitution of circuit can be provided. In addition, since this oscillator has an oscillating circuit which includes transistors and the like, the miniaturization can be realized by the integration with the transistors.

The electronic circuit of the present invention includes an oscillator described above and an electrical signal supplying element which applies the electrical signals to the electrodes for applying electrical signals and which is provided on the oscillator, wherein specified frequencies can be selected from frequencies of the electrical signals applied, the electrical signals applied can be transformed into specified frequencies, a predetermined modulation can be applied to the electrical signals, a predetermined demodulation can be carried out on the electrical signals, or a predetermined detection can be carried out on the electrical signals.

According to this electronic circuit, the piezoelectric material film, which is employed in the surface acoustic wave element provided in the oscillator, has better piezoelectric characteristics, and therefore, this piezoelectric material film has a large electromechanical coupling coefficient, and thereby the electronic circuit can be integrated with an oscillating circuit and the miniaturization can be realized.

The thin film piezoelectric resonating device of the present invention includes a resonator made of the piezoelectric element described above which is formed on a substrate, wherein a piezoelectric material film provided in the piezoelectric element is made of $BiFeO_3$ and has a rhombohedral structure in a pseudo-cubic system with a (100)-orientation.

According to this thin film piezoelectric resonating device, since the piezoelectric element made of $BiFeO_3$ has a large electromechanical coupling coefficient, a high frequency band, e.g., GHz band, can be used. In addition, this thin film piezoelectric resonating device has a high performance and is environmentally preferable because the piezoelectric material film made of $BiFeO_3$ does not include Pb that is detrimental to the environment.

Moreover, if via holes are formed at the opposite side of the side at which the resonator of the base substance is formed in such a thin film piezoelectric resonating device, the thin film piezoelectric resonating device becomes one of the diaphragm type.

Additionally, if an air gap is formed between the resonator and the base substance, it becomes one of the air-gap type.

The electronic apparatus of the present invention includes at least one of the frequency filter, the oscillator, the electronic circuit and the above-mentioned thin film piezoelectric resonating device.

According to the electronic apparatus, the piezoelectric material film has better piezoelectric characteristics, and therefore, this piezoelectric material film has a large electromechanical coupling coefficient, and thereby miniaturization with high performance can be realized.

BRIEF DESCRIPTION OF THE DRAWINGS

FIGS. 8A and 8B are schematic illustrations for explaining behaviors of the head.

DETAILED DESCRIPTION OF THE INVENTION

Figure 1:
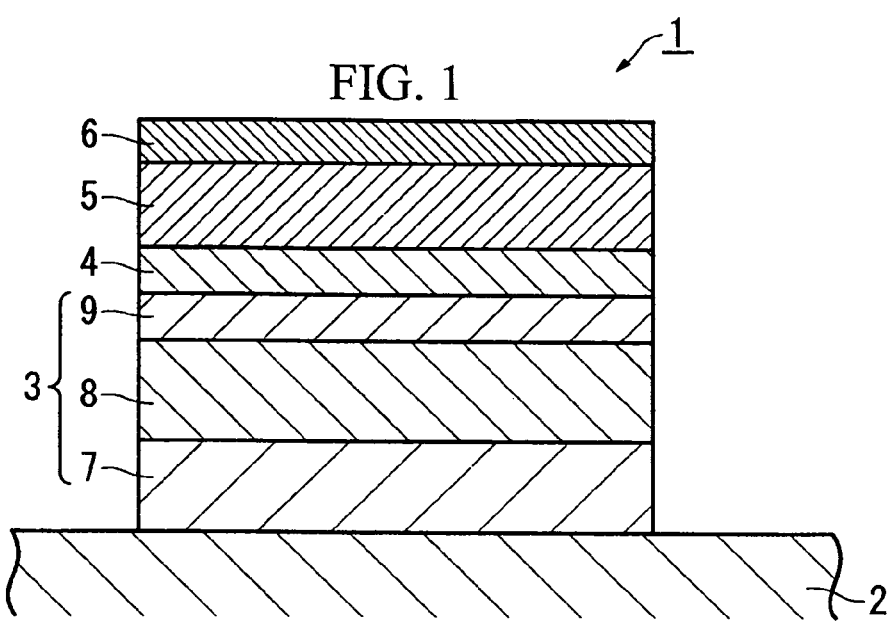
FIG. 1 is a cross-sectional view of an embodiment of the piezoelectric element of the present invention.

A layer formed of grains with a single orientation, i.e., only with an orientation parallel to the through-thickness of a layer, is preferably used as the buffer layer 3, and it is more preferable that the grains in the buffer layer also have a planer orientation, i.e., the grains have orientations in all three-dimensions. This is because good bonding or adhesion between a base substance 2 made of the Si substrate with a natural oxide film thereon and the lower electrode 4 described later can be attained by including the buffer layer 3.

It is preferable that this buffer layer 3 include at least one of metal oxides with a NaCl structure, metal oxides with a fluorite structure, and metal oxides with a perovskite structure, and it is especially preferable that the buffer layer 3 be formed of a layered structure of a metal oxide with a NaCl structure or a metal oxide with a fluorite structure, and a metal oxide with a perovskite structure. This is because the lattice mismatch between a metal oxide with a NaCl structure or a metal oxide with a fluorite structure and a metal oxide with a perovskite structure is small, and therefore it is advantageous to form a layer with a perovskite structure on which the lower electrode 4, especially with a perovskite structure is formed, as described later.

For this reason, the buffer layer 3 of the present embodiment is formed from a first buffer layer 7 and a second buffer layer 8, both of which are made of a metal oxide with a NaCl structure or a metal oxide with a fluorite structure, and a third buffer layer 9 made of a metal oxide with a perovskite structure formed on the second buffer layer 8.

The first buffer layer 7 is a component of the buffer layer of the present invention, which is formed using an ion beam assist deposition method, and can be made of yttrium stabilized zirconia (YSZ) with a cubic system with a (100)-orientation, with a thick thickness of e.g., 1 µm. A YSZ expressed by the following formula can be used.

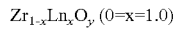

$Zr_{1-x}Ln_xO_y$ (0=x=1.0)

(Ln:Y, La, Ce, Pr, Nd, Sm, Eu, Gd, Th, Dy, Ho, Er, Tm, Yb, Lu)

The reason why this first buffer layer 7 is thick is that the first buffer layer 7 acts as an etching stopper layer on forming an ink cavity in the base substance by an etching described later. Since this first buffer layer 7 is thick, the first buffer layer 7 can act substantially as an elastic plate when the buffer layer 3 is formed as an elastic plate in the ink jet recording head 50, as described above.

This first buffer layer 7 is directly formed on the base substance 2, where a natural oxide (SiO$_2$) film is usually grown on the surface of the base substance 2 of a Si substrate. It is difficult to grow an epitaxial layer of YSZ on this natural oxide by usual film formation methods. For this reason, in this embodiment, the first buffer layer 7 can grow epitaxially especially using an ion beam assist deposition method, described later. The natural oxide film grown on the base substance 2 may be an amorphous film.

The second buffer film 8 can be made of CeO$_2$ with a cubic system with a (100)-orientation, e.g., of a thickness of 100 nm, which is grown epitaxially on the first buffer layer 7.

Materials for the first buffer layer 7 or the second buffer layer 8 are not restricted to YSZ or CeO$_2$, and can be a metal oxide with a NaCl structure or a metal oxide with a fluorite structure. MgO, CaO, SrO, BaO, MnO, FeO, CoO, NiO and solid solutions including these compounds are representatives of a metal oxide with a NaCl structure, and it is preferable that MgO, CaO, SrO, BaO or solid solutions including one of these compounds, among these, be used. Lattice mismatches between these metal oxides with a NaCl structure and a metal oxide with a perovskite structure are very small.

YSZ, CeO$_2$, ZrO$_2$, ThO$_2$, UO$_2$, and solid solutions including these compounds are representatives of a metal oxide with a fluorite structure, and it is preferable that at least one of YSZ, CeO$_2$, ZrO$_2$ and solid solutions including one of these compounds, among these, be used. Lattice mismatches between these metal oxides with a fluorite structure and a metal oxide with a perovskite structure are very small.

The third buffer layer 9 can be made of YBa$_2$Cu$_3$O$_x$ (e.g., x is 7), which is a layered oxide with a perovskite structure, and grown epitaxially on the second buffer layer 8 with an orthorhombic system with a (001)-orientation, e.g., of a thickness of 30 nm. Since the third buffer layer 9 is made of a metal oxide with a perovskite structure, a lattice mismatch between the third buffer layer 9 and the second buffer layer 8 is very small. Therefore, a film with substantially no defects in the crystal structure can grow, and a lower electrode 4 with a perovskite structure can grow epitaxially on this third buffer layer 9.

Materials for the third buffer layer 9 are not restricted to YBa$_2$Cu$_3$O$_3$ (e.g., x is 7), and can be another metal oxide with a perovskite structure. CaRuO$_3$, SrRuO$_3$, BaRuO$_3$, SrVO$_3$, (La, Sr)MnO$_3$, (La, Sr)CrO$_3$, (La, Sr)CoO$_3$, or solid solutions including these compounds can be used.

The lower electrode 4 is made of a metal oxide with a perovskite structure which is the same as that of the third buffer layer 9, and is grown epitaxially with a pseudo cubic system with a (100)-orientation, e.g., of a thickness of 50 nm. The same compounds which can be used for the third buffer film 9 can be applied as a metal oxide with a perovskite structure of which the lower electrode 4 is made, and at least one of SrRuO$_3$, Nb—SrTiO$_3$, La—SrTiO$_3$, and (La, Sr)CoO$_3$ can be preferably used, where Nb—SrTiO$_3$ is SrTiO$_3$ doped with Nb, and La—SrTiO$_3$ is SrTiO$_3$ doped with La. Since these compounds have high electric conductivity and high chemical stability, the lower electrode 4 made of these compounds has high electric conductivity and high chemical stability. Additionally, BiFeO$_3$ with a rhombohedral structure in a pseudo-cubic system with a (100)-orientation, can grow with good quality on the electrode 4. In this embodiment, SrRuO$_3$ with a pseudo cubic system with a (100)-orientation is used.

Figure 2A:
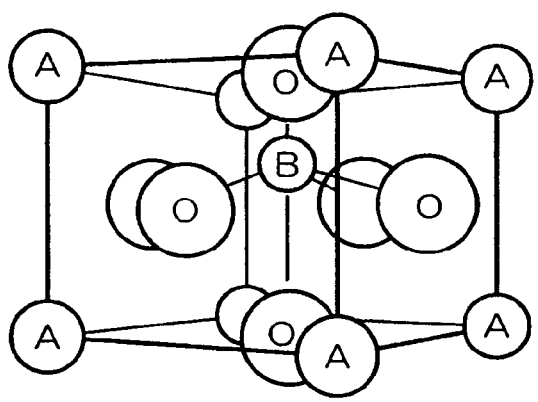
FIGS. 2A and 2B are schematic illustrations of a perovskite crystal structure.
Figure 2B:
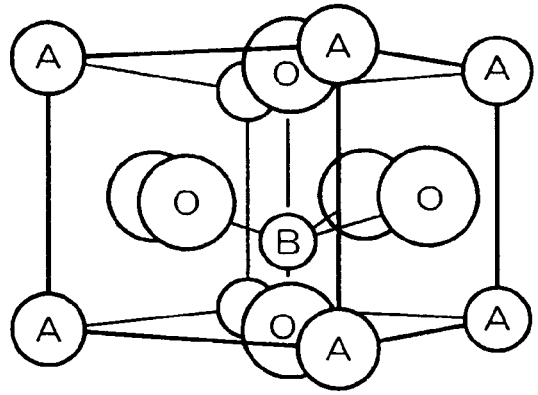

The piezoelectric material film 5 is made of BiFeO$_3$ with a perovskite structure, and in this embodiment, this piezoelectric material film 5 is grown epitaxially with a rhombohedral structure in a pseudo-cubic system with a (100)-orientation, e.g., of a thickness of 1 µm. Such a BiFeO$_3$ with a rhombohedral structure in a pseudo-cubic system with a (100)-orientation can be obtained by adjusting conditions for forming a film, especially, the temperature and the like. Perovskite structures are shown in FIGS. 2A and 2B, where a position indicated by A is an A-site, and a position indicated by B is a B-site. In BiFeO$_3$, a Bi atom is located at an A-site and an Fe atom is located at a B-site. O (oxygen) is located at a position indicated by O in FIGS. 2A and 2B.

In such a BiFeO$_3$ with a perovskite structure, some Fe atoms located at B-sites can be substituted by magnetic metal atoms. It is preferable that such magnetic metal atoms be at least one selected from the group of Mn, Ru, Co, and Ni. By this addition of the magnetic metal atoms, the magnetism of the BiFeO$_3$ piezoelectric material film 5 is strengthened and its dielectric characteristic is improved, which can result in higher piezoelectric characteristic of the piezoelectric element 1. It is preferable that Mn atoms or Ru atoms whose ionic radii are larger than that of Fe be added, and by this substitution by these metal atoms, a $BiFeO_3$ layer with a rhombohedral structure can grow epitaxially with good quality.

It is preferable that an amount of an addition of the magnetic metal atoms be such that 1 to 10% of Fe atoms located at all of the B-sites in the crystal structure of the piezoelectric material film 5 is substituted due to the addition. In the case of less than 1%, the substitution cannot improve the magnetism very much, and in the case in which it is more than 10%, it is not expected that the substitution can improve the magnetism more than that of the case of less than 10%. In the case of Mn, Mn atoms can be substituted for 1 to 30% of Fe atoms located at all of the B-sites in the crystal structure of the piezoelectric material film 5. This is because the magnetism can be improved by the substitution of more than 10%, and up to 30%.

In the $BiFeO_3$, some Fe atoms located at B-sites can be substituted by metal atoms whose valencies are higher than that of Fe. It is preferable that metal atoms whose valencies are higher than that of Fe (+3 value) be selected from the group of V (+5 value), Nb (+5 value), Ta (+5 value), W (+5 value), Ti (+4 value), Zr (+4 value), and Hf (+4 value). In $BiFeO_3$ with a perovskite structure, Bi atoms located at A-sites in the structure evaporate easily and accordingly the A-sites form defects. In a $BiFeO_3$ crystal which has defects of missing Bi atoms at A-sites in the structure, a current leaks easily through the crystal because the $BiFeO_3$ crystal is no longer electrically neutral and no longer electrically insulated. By the substitution of some Fe atoms located at B-sites by metal atoms whose valencies are higher than that of Fe, the $BiFeO_3$ crystal can be maintained neutral and insulated in the entire crystal, which results in the prevention of the current leakage.

It is preferable that an amount of an addition of the metal atoms whose valencies are higher than Fe be such that 1 to 30% of Fe atoms located at all of the B-sites in the crystal structure of the piezoelectric material film 5 is substituted due to the addition. In the case in which it is less than 1%, the substitution cannot sufficiently improve the prevention of the current leakage, and in the case in which it is more than 30%, it cannot be expected that the substitution can improve the prevention of the current leakage more than that of the case of less than 30%.

The upper electrode 6 is made of $SrRuO_3$, and is grown epitaxially with a pseudo cubic system with a (100)-orientation, e.g., of a thickness of 50 nm, which is the same as that of the lower electrode 4. The materials of the upper electrode 6 are not restricted to $SrRuO_3$, and Pt, Ir, $IrO_x$ and other known materials for an electrode can be used.

In manufacturing such a piezoelectric element 1, first, a base substance 2 of a Si substrate with a surface of a (110)-plane is prepared. The base substance 2 of a Si substrate having sufficient thickness in order to form a cavity (ink cavity), which is described later, is used.

Next, the base substance 2 of a Si substrate is loaded on a substrate holder, and these are installed in a vacuum chamber (not shown). In the vacuum chamber, targets, (a target for each buffer layer) including constituent elements of the buffer layers 7, 8 and 9, and targets including constituent elements of the lower electrode 4, the piezoelectric material film 5, and the upper electrode 6 are located by being spaced with predetermined distances, and facing the base substance 2. Each target whose composition is the same as or similar to a composition of the first buffer layer 7, the second buffer layer 8, the third buffer layer 9, the lower electrode 4, the piezoelectric material film 5, or the upper electrode 6, is preferably used.

That is, YSZ of a desired composition or a composition similar to that is preferably used as a target for the first buffer layer 7, $CeO_2$ of a desired composition or a composition similar to that is preferably used as a target for the second buffer layer 8, and $YBa_2Cu_3O_x$ of a desired composition or a composition similar to that is preferably used as a target for the third buffer layer 9. $SrRuO_3$ of a desired composition or a composition similar to that is preferably used as both targets for the lower electrode 4 and the upper electrode 6, and a $BiFeO_3$ of a desired composition or a composition similar to that is preferably used as a target for the piezoelectric material film 5.

Figure 3A:
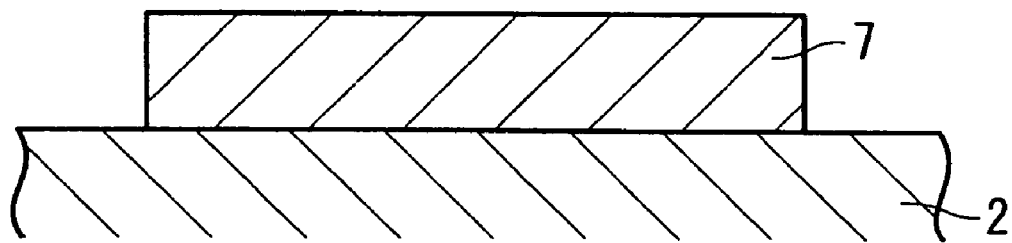
FIGS. 3A to 3C are cross-sectional views which schematically show stages of manufacturing the piezoelectric element.

As described above, the first buffer layer 7 is directly formed on the base substance 2 using an ion beam assist deposition method, as shown in FIG. 3A. That is, using a laser ablation method in which laser light is irradiated on the target for the first buffer layer 7 and thereby atoms including oxygen atoms and gold atoms are ejected out from the target, and a plume is generated. The plume targets the base substance 2 and makes contact with the base substance 2. At substantially the same time, an ion assist is carried out, that is, an ion beam is irradiated on the surface of the base substance 2 from a predetermined angle (described later). Using such an ion assist, a YSZ layer grows epitaxially with a cubic system with a (100)-orientation, despite the presence of a natural oxide film on the surface of the base substance 2.

As methods for ejecting constituent atoms of YSZ from the target, besides the method of laser irradiation on the target surface described above, for example, methods of irradiating an argon gas (an inert gas) plasma or electrons on the target surface can be used. However, the method of laser irradiation on the target surface is the most preferable of these methods. According to these methods, atoms can be ejected from the target easily and reliably by using a simple vacuum chamber with a window for laser irradiation.

A pulse laser with a wavelength of 150 to 300 nm and a pulse duration of 1 to 100 ns can be preferably used as a laser irradiated on the target. Specifically, an excimer laser including such as an ArF excimer laser, a KrF excimer laser, and an XeCl excimer laser, a YAG laser, $YVO_4$ laser, and $CO_2$ laser may be mentioned. An ArF excimer laser or a KrF excimer laser is especially preferable among these. The ArF excimer laser and the KrF excimer laser are both easy to handle, and atoms can be ejected more efficiently from the target thereby.

Ions irradiated on a surface of the base substance 2 in an ion beam assist are not restricted to a specific kind of ion, and at least one kind of ion selected form the group of inert gases such as argon, helium, neon, xenon, and krypton, and ions mixed with one or more of these ions and oxygen ions are preferably used. For example, a Kauffman-type ion source is preferable as an ion beam source, and an ion beam can be rather easily generated therewith.

The predetermined angle from which an ion beam is irradiated on a surface of the base substance 2 is not restricted to a specified angle, but an angle of 35 to 65 degrees inclined to the surface of the base substance 2 is preferable. In the case of forming the first buffer layer 7 made mainly of a metal oxide with a NaCl structure, 42 to 47 degrees of the irradiation angle is preferable, and in the case of forming a first buffer layer 7 made mainly of a metal oxide with a fluorite structure, 52 to 57 degrees of the irradiation angle is preferable. In this example, since the first buffer layer 7 is made of YSZ of a metal oxide with a fluorite structure, 52 to 57 degrees of the irradiation angle, especially around 55 degrees, is used. The first buffer layer 7 in a cubic system with a (100)-orientation with high quality can be formed on the surface of the base substance 2 by an irradiation of ion beams with such an irradiation angle to the base substance 2.

Ions such as argon ions are irradiated on targets from the <111> direction against the target and, at the same time, a laser ablation is carried out on the targets. When the first buffer layer 7 with a metal oxide with a NaCl structure such as MgO is formed, ions such as argon ions are irradiated on targets from the <110> direction against the target and, at the same time, a laser ablation is carried out on the targets.

Conditions for forming such a first buffer layer 7 are not specifically restricted, provided that the first buffer layer 7 can grow epitaxially, e.g., the following conditions can be adopted. The frequency of the laser is preferably less than 30 Hz, and more preferably less than 15 Hz. The energy density of the laser is preferably more than 0.5 J/cm$^2$, and more preferably more than 2 J/cm$^2$.

The acceleration voltage is preferably around 100 to 300 V, and more preferably around 150 to 250 V. The dose of the ion beam is preferably around 1 to 30 mA, and more preferably around 5 to 15 mA.

The temperature of a base substance 2 is preferably around 0 to 50° C., and more preferably around room temperature (5 to 30° C.). The distance between the Si substrate (base substance 2) and the target is preferably less than 60 mm, and more preferably less than 45 mm.

The pressure in the vacuum chamber is preferably less than $133\times10^{-1}$ Pa ($1\times10^{-1}$ Torr), and more preferably less than $133\times10^{-3}$ Pa ($1\times10^{-3}$ Torr). The inert gas to oxygen ratio in an ambient atmosphere in the vacuum chamber is preferably 300:1 to 10:1 in volume ratio, and more preferably 150:1 to 50:1. The first buffer layer 7 can grow epitaxially with more efficiency if conditions for formation of the first buffer layer 7 are adopted within the range described above.

The average thickness of the first buffer layer 7 can be adjusted to be the thickness, i.e., around 1 μm by adjusting appropriately the irradiation durations of both the laser and the ion beam. It is usually preferable that these irradiation durations of both the laser and the ion beam be less than 200 seconds, and it is more preferable that they be less than 100 seconds, although these depend on the conditions described above.

According to such a formation method of the first buffer layer 7, the first buffer layer 7 is epitaxially grown in a cubic system with a (100)-orientation, as described above, by using an ion beam assist in which the irradiation of an ion beam can be adjusted, despite the presence of a natural oxide film formed on the surface of the base substance 2. In this way, the directions of orientation of the crystal grains of the first buffer layer 7 can be matched with high precision, and therefore the average thickness of the first buffer layer 7 can become thinner, if necessary.

Figure 3B:
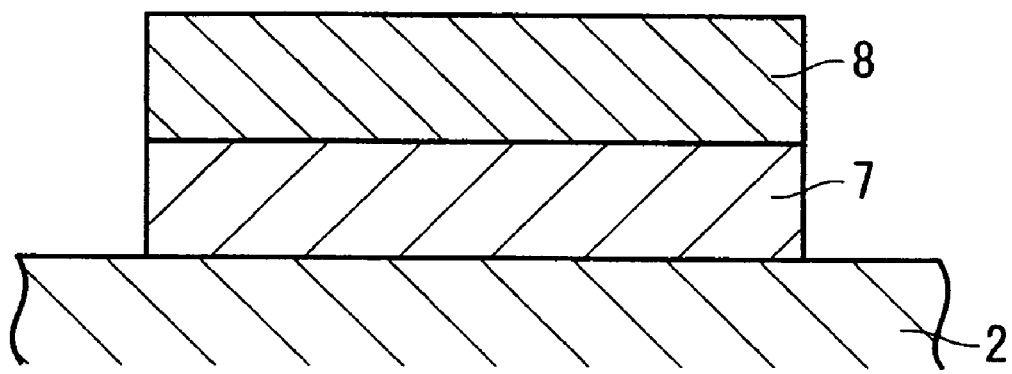

After the first buffer layer 7 is formed in this way, the second buffer layer 8 is formed on the first buffer layer 7, as shown in FIG. 3B. This second buffer layer 8 can be formed only using a laser ablation method, without an ion beam assist, because the second buffer layer 8 is formed on the first buffer layer 7 having a crystal structure with fewer defects, which is different from the case of the formation of the first buffer layer 7 on the natural oxide film. That is, CeO$_2$ of a desired composition or a composition similar to that is used as the target of the second buffer layer 8, instead of the target for the first buffer layer 7, laser light is irradiated on this target and thereby atoms including oxygen atoms and metal atoms are ejected from the target, and a plume is generated. The plume targets the first buffer layer 7 formed on the base substance 2 and makes contact with the layer 7, and then the second buffer layer 8 grows epitaxially. The conditions, e.g., for laser ablation, and for forming the second buffer layer 8 are the same as those for forming the first buffer layer 7.

Figure 3C:
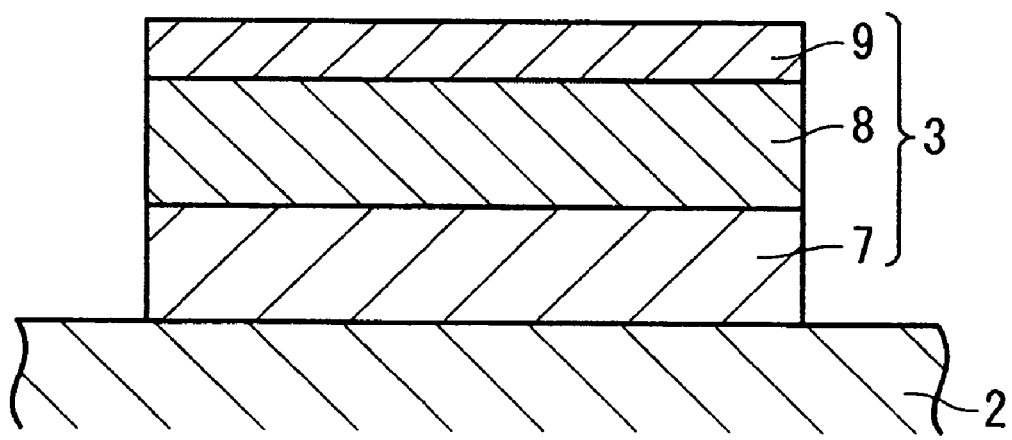

Next, the third buffer layer 9 is formed on the second buffer layer 8, as shown in FIG. 3C, and consequently a buffer layer 3 including the first buffer layer 7, the second buffer layer 8, and the third buffer layer 9 is obtained. This third buffer layer 9 can be formed using a laser ablation method by itself, in the same way as the second buffer layer 8. That is, YBa$_2$Cu$_3$O$_x$ of a desired composition or a composition similar to that is used as the target for the third buffer layer 9, instead of the target for the second buffer layer 8. Laser light is irradiated on this target and thereby atoms including oxygen atoms and metal atoms are ejected from the target, and a plume is generated. The plume targets the second buffer layer 8 above the base substance 2 and makes contact with the second buffer layer 8, and then the third buffer layer 9 grows epitaxially.

In the formation of the third buffer layer 9, an ion beam assist can be used if necessary, in the same way as the formation of the second buffer layer 8. That is, as an ion beam is irradiated on the surface of the second buffer layer 8, the third buffer layer 9 can be formed on the second buffer layer 8. This third buffer layer 9 can be formed more efficiently with the ion beam assist.

The conditions for forming such a third buffer layer 9 are not specifically restricted, provided that all kinds of metal atoms can reach the second buffer layer 8 at a desired rate (i.e., the composition of a metal oxide with a perovskite structure) and the third buffer layer 9 can grow epitaxially, e.g., the following conditions can be adopted.

The frequency of the laser is preferably less than 30 Hz, and more preferably less than 15 Hz. The energy density of the laser is preferably more than 0.5 J/cm$^2$, and more preferably more than 2 J/cm$^2$.

The temperature of the base substance 2, above which the second buffer layer 8 is formed, is preferably around 300 to 800° C., and more preferably around 700° C. The temperature is preferably around 0 to 50° C., and more preferably around room temperature (5 to 30° C.) with the simultaneous use of ion beam irradiation. The distance between the base substance 2, above which the second buffer layer 8 is formed, and the target is preferably less than 60 mm, and more preferably less than 45 mm.

The pressure in the vacuum chamber is preferably less than 1 atm, where a partial pressure of oxygen of the pressure is preferably around $399\times10^{-3}$ Pa ($3\times10^{-3}$ Torr). In the case of the simultaneous use of the ion beam irradiation, the pressure in the vacuum chamber is preferably less than $133\times10^{-1}$ Pa ($1\times10^{-1}$ Torr), and more preferably less than $133\times10^{-3}$ Pa ($1\times10^{-3}$ Torr). In this case, the inert gas to oxygen ratio in the vacuum chamber is preferably 300:1 to 10:1 in volume ratio, and more preferably 150:1 to 50:1.

The third buffer layer 9 can grow epitaxially with more efficiency if the conditions for formation of the third buffer layer 9 are adopted within the range described above. The average thickness of the third buffer layer 9 can be adjusted to be the thickness, i.e., around 30 nm by adjusting appropriately the irradiation durations of both the laser beam and the ion beam. It is usually preferable that the irradiation duration of the laser be around 3 to 90 minutes, and it is more preferable that it be around 15 to 45 minutes, although this depends on this conditions described above.

Figure 4A:
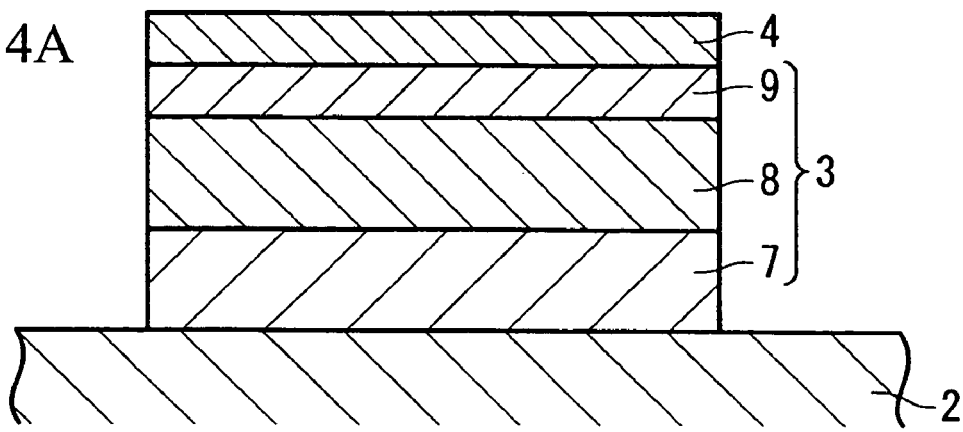
FIGS. 4A to 4C are cross-sectional views which schematically show stages of manufacturing the piezoelectric element.

After the third buffer layer 9 is formed in this way, and thereby the buffer layer 3 is completed, the lower electrode 4 with a perovskite structure is formed on the third buffer layer 9 (buffer layer 3), as shown in FIG. 4A. This lower electrode 4 can be formed only using a laser ablation method by itself, without an ion beam assist, because the lower electrode 4 is formed on the third buffer layer 9 with a perovskite structure with high quality. That is, $SrRuO_3$ of a desired composition or a composition similar to that is used as the target for the lower electrode 4, instead of the target for the third buffer layer 9, laser light is irradiated on this target and thereby atoms including oxygen atoms and metal atoms are ejected from the target, and a plume is generated. The plume targets the third buffer layer 9 formed above the base substance 2 and makes contact with the layer 9, and then the lower electrode 4 grows epitaxially.

The conditions for forming the lower electrode 4 are not restricted to specified ones, provided that all kinds of metal atoms can reach the third buffer layer 9 at a desired rate (i.e., the composition of a metal oxide with a perovskite structure) and the lower electrode 4 can grow epitaxially, e.g., the same conditions, for laser ablation, and for forming the third buffer layer 9, can be applied.

In the formation of the lower electrode 4, an ion beam assist can be used if necessary, in the same way as in the formation of the third buffer layer 9. That is, as an ion beam is irradiated on the surface of the third buffer layer 9, the lower electrode 4 can be formed on the third buffer layer 9. The lower electrode 4 can be formed more efficiently with the ion beam assist.

Figure 4B:
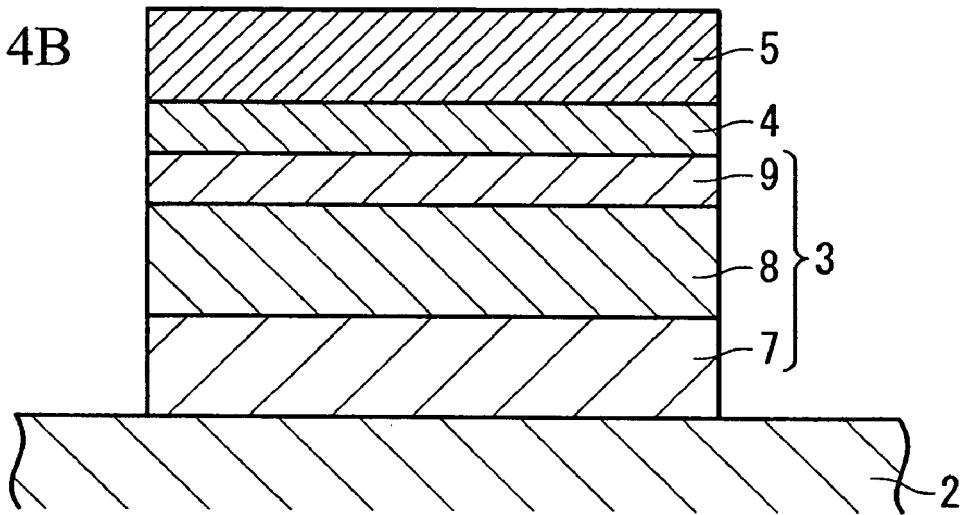

Next, the piezoelectric material film 5 is formed on the lower electrode 4, as shown in FIG. 4B. The piezoelectric material film 5 made of $BiFeO_3$ with a rhombohedral structure in a pseudo-cubic system with a (100)-orientation can be formed only using a laser ablation method, without an ion beam assist, because the ferroelectric layer 5 is formed on the lower electrode 4 with a perovskite structure with high quality. That is, $BiFeO_3$ of a desired composition or a composition similar to that is used as a target of the piezoelectric material film 5, instead of a target for the lower electrode 4, laser light is irradiated on this target and thereby atoms including oxygen atoms and metal atoms are ejected from the target, and a plume is generated. The plume targets the lower electrode 4 formed above the base substance 2 and makes contact with the lower electrode 4, and then a piezoelectric material film 5 made of $BiFeO_3$ with a rhombohedral structure in a pseudo-cubic system with a (100)-orientation grows epitaxially.

$BiFeO_3$ can be used as the target for the piezoelectric material film 5, but $BiFeO_3$, in which some Fe atoms located at B-sites in the structure are substituted by magnetic metal atoms, such as Mn, Ru, Co, and Ni, or metal atoms whose valencies are higher than that of Fe, such as V, Nb, Ta, W, Ti, Zr, and Hf, can be used. A piezoelectric material film 5 with higher performance can be formed using these targets.

Conditions for forming the piezoelectric material film 5 are not restricted to specific ones, provided that all kinds of metal atoms can reach the lower electrode 4 at a desired rate (i.e., the composition of a metal oxide with a perovskite structure) and a piezoelectric material film 5 can grow epitaxially, e.g., the same conditions for laser ablation, and for forming the third buffer layer 9 and the lower electrode 4, can be applied. In the formation of the piezoelectric material film 5, an ion beam assist can be used if necessary, in the same way as in the formation of a third buffer layer 9. That is, as an ion beam is irradiated on the surface of the lower electrode 4, the piezoelectric material film 5 can be formed on the lower electrode 4. This piezoelectric material film 5 can be formed more efficiently with the ion beam assist.

Figure 4C:
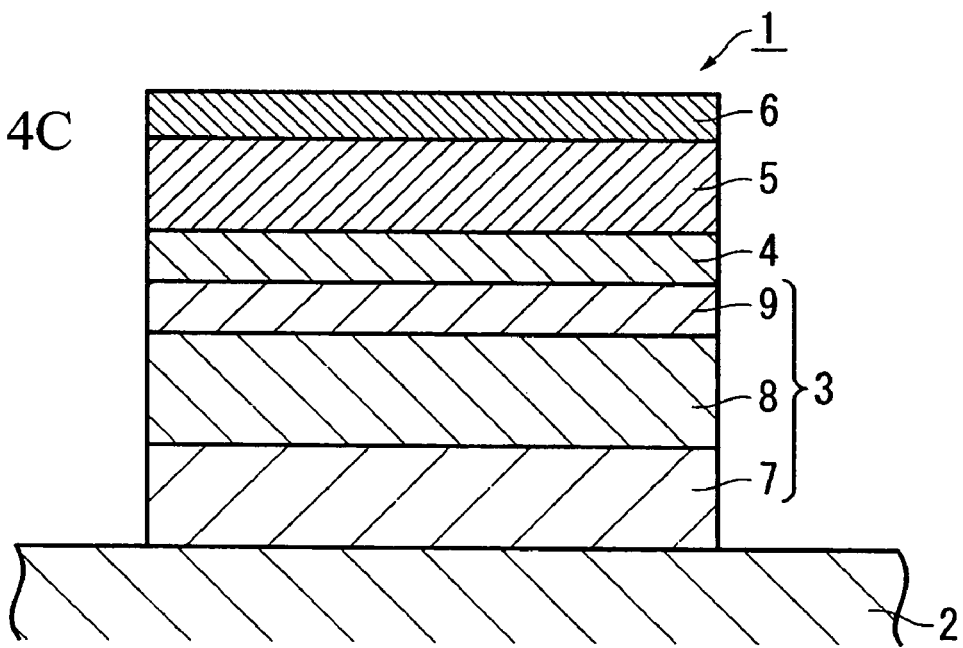

Next, the upper electrode 6 is formed on the piezoelectric material film 5 as shown in FIG. 4C, and the piezoelectric element 1 of one embodiment of the present invention is obtained. In the same way as in the case of the lower electrode 4 and the piezoelectric material film 5, the (100)-oriented upper electrode 6 with a pseudo cubic system with high quality can be formed only using a laser ablation method, without an ion beam assist, because the upper electrode 6 is formed on the piezoelectric material film 5 with a perovskite structure with high quality. That is, $SrRuO_3$ of a desired composition or a composition similar to that is used as the target for the upper electrode 6, instead of a target for the piezoelectric material film 5, laser light is irradiated on this target and thereby atoms including oxygen atoms and metal atoms are ejected from the target, and a plume is generated. The plume targets the piezoelectric material film 5 formed above the Si substrate (base substance 2) and makes contact with the piezoelectric material film 5, and then a (100)-oriented upper electrode 6 with a pseudo cubic system grows epitaxially.

The conditions for forming the upper electrode 6 are not specifically restricted, provided that all kinds of metal atoms can reach the piezoelectric material film 5 at a desired rate (i.e., the composition of a metal oxide with a perovskite structure) and the upper electrode 6 can grow epitaxially, e.g., the same conditions, for laser ablation, and for forming the third buffer layer 9 and the lower electrode 4, can be applied. In the formation of the upper electrode 6, an ion beam assist can be used if necessary, in the same way as in the formation of the third buffer layer 9. That is, as an ion beam is irradiated on the surface of the piezoelectric material film 5, the upper electrode 6 can be formed on the piezoelectric material film 5. The upper electrode 6 can be formed more efficiently with the ion beam assist.

X-ray diffraction analysis of the piezoelectric material layer 5 in the piezoelectric element 1 obtained in this way showed that the piezoelectric material layer 5 has a rhombohedral structure in a pseudo-cubic system with a (100)-orientation at room temperature. Therefore, in the piezoelectric element 1 of the present embodiment, the piezoelectric material layer 5 exhibits good ferroelectric characteristics, and thereby the piezoelectric element 1 has a very high performance. Additionally, since it is possible to directly implement the piezoelectric element 1 onto the base substance 2, this piezoelectric element 1 can be formed in the ink jet recording head by thin film processes, described later, and therefore the miniaturization such as the high-densification of the nozzles can be realized. In addition, the piezoelectric material layer 5 is environmentally preferable because Pb is not included.

Moreover, in the above-mentioned embodiment, a piezoelectric material layer, which is grown with a rhombohedral structure in a pseudo-cubic system with a (100)-orientation, is used as the piezoelectric material layer 5; however, the present invention is not restricted to such a piezoelectric material layer, e.g., a piezoelectric material layer, which is grown with a tetragonal structure in a pseudo-cubic system with a (111)-orientation, may be used.

In the case in which the piezoelectric element 1 having the piezoelectric material layer 5 with a tetragonal structure in a pseudo-cubic system with a (111)-orientation is manufactured, similarly to the previous embodiment, the buffer layer 3 is formed on the base substance 2, and the lower electrode 4 is formed on the buffer layer 3.

The buffer layer 3 is formed of YSZ with a (111)-orientation by self-orientation. That is, since YSZ has a fluorite structure and metal atoms in the structure are arranged with a face-centered cubic structure, it easily takes a self-orientation with a (111)-orientation. In the same way as the previous embodiment, the first buffer layer 7 of YSZ with a (111)-orientation is formed by laser ablation, and the second buffer layer 8 and third buffer layer 9 are formed of transition metal oxides with a (111)-plane. In another method of forming the buffer layer 3, the buffer layer 3 is formed of ZnO with a hexagonal structure with a (0001) self-orientation. Similarly to the previous embodiment, the first buffer layer 7 of ZnO with a hexagonal structure with a (0001) self-orientation is formed by a laser ablation, and the second buffer layer 8 and third buffer layer 9 are formed of transition metal oxides with a (111)-plane.

After the buffer layer 3 is formed in this way, the (111)-oriented lower electrode 4 with a perovskite structure of a thickness of around 50 nm is grown with an orientation on the third buffer layer 9. The materials for forming the third buffer layer 9 in the previous embodiment can be applied for forming this lower electrode 4 with a perovskite structure grown with an orientation, and especially at least one of $SrRuO_3$, $Nb—SrTiO_3$, $La—SrTiO_3$, and $(La,Sr)CoO_3$ can be preferably applied. These metal oxides have good electric conductivity and good chemical stability, and therefore the lower electrode 4 made of these metal oxides has good electric conductivity and good chemical stability. Additionally, a (111)-oriented $BiFeO_3$ ferroelectric layer with a tetragonal structure with good quality can be formed on the lower electrode 4. In this example, $SrRuO_3$ with a (111)-orientation is used.

A laser ablation method is used in the formation of the lower electrode 4, and an ion beam assist can be used if necessary. That is, as an ion beam is irradiated on the surface of the third buffer layer 9, a lower electrode 4 can be formed on the third buffer layer 9.

Next, the piezoelectric material layer 5 is formed on the lower electrode 4. A (111)-oriented piezoelectric material layer 5 with a tetragonal structure of high quality can be formed using a laser ablation method because the piezoelectric material layer 5 is formed on the lower electrode 4 with a (111)-orientation. That is, $BiFeO_3$ of a desired composition or a composition similar to that is used as the target for the piezoelectric material layer 5, laser light is irradiated on this target and thereby atoms including oxygen atoms and metal atoms are ejected from the target, and a plume is generated. The plume targets the lower electrode 4 formed above the base substance 2 and makes contact with the lower electrode 4, and then a (111)-oriented piezoelectric material layer 5 with a rhombohedral structure grows.

The same targets for the piezoelectric material layer 5 can be applied as targets for the piezoelectric material layer 5. The conditions for forming the piezoelectric material layer 5 can also be applied to conditions for forming the piezoelectric material layer 5. For forming the piezoelectric material layer 5, an ion beam assist can be used if necessary. That is, as an ion beam is irradiated on the surface of the lower electrode 4, the piezoelectric material layer 5 can be formed on the lower electrode 4. The piezoelectric material layer 5 can be formed more efficiently with the ion beam assist.

Next, the upper electrode 6 is formed on the the piezoelectric material layer 5 and a piezoelectric element 1 of the present invention is obtained. As the upper electrode 6, e.g., a perovskite $SrRuO_3$ with a (111)-orientation can be employed, in the same way as for the lower electrode.

X-ray diffraction analysis of the piezoelectric material layer 5 in the piezoelectric element 1 obtained in this way showed that the piezoelectric material layer 5 has a tetragonal structure in a pseudo-cubic system with a (111)-orientation at room temperature. Therefore, in the piezoelectric element 1 of the present embodiment, the piezoelectric material layer 5 exhibits good ferroelectric characteristics, and thereby the piezoelectric element 1 has a very high performance. Additionally, since it is possible to directly form the piezoelectric element 1 on the base substance 2, this piezoelectric element 1 can be formed in the ink jet recording head by thin film processes, described later, and therefore the miniaturization such as the high-densification of the nozzles can be realized. In addition, the piezoelectric material layer 5 is environmentally preferable because no Pb is included.

While an electrode made of perovskite material with a (111) orientation is used as the lower electrode 4 in this example, an electrode made of Pt can be used instead of the electrode made of perovskite material. Since a Pt film grows with a (111)-orientation regardless of the kind of film formation method used, this lower electrode can be easily formed with an orientation on the buffer layer 3, for example, using a rather simpler method such as sputtering.

Figure 5:
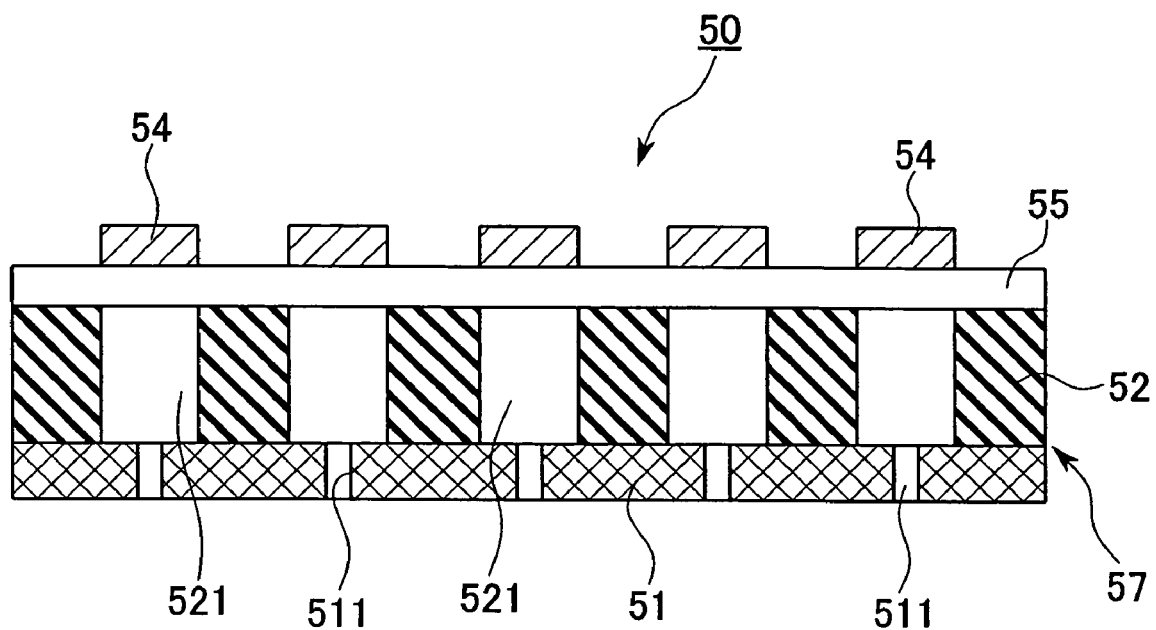
FIG. 5 is a schematic illustration of the ink jet recording head.
Figure 6:
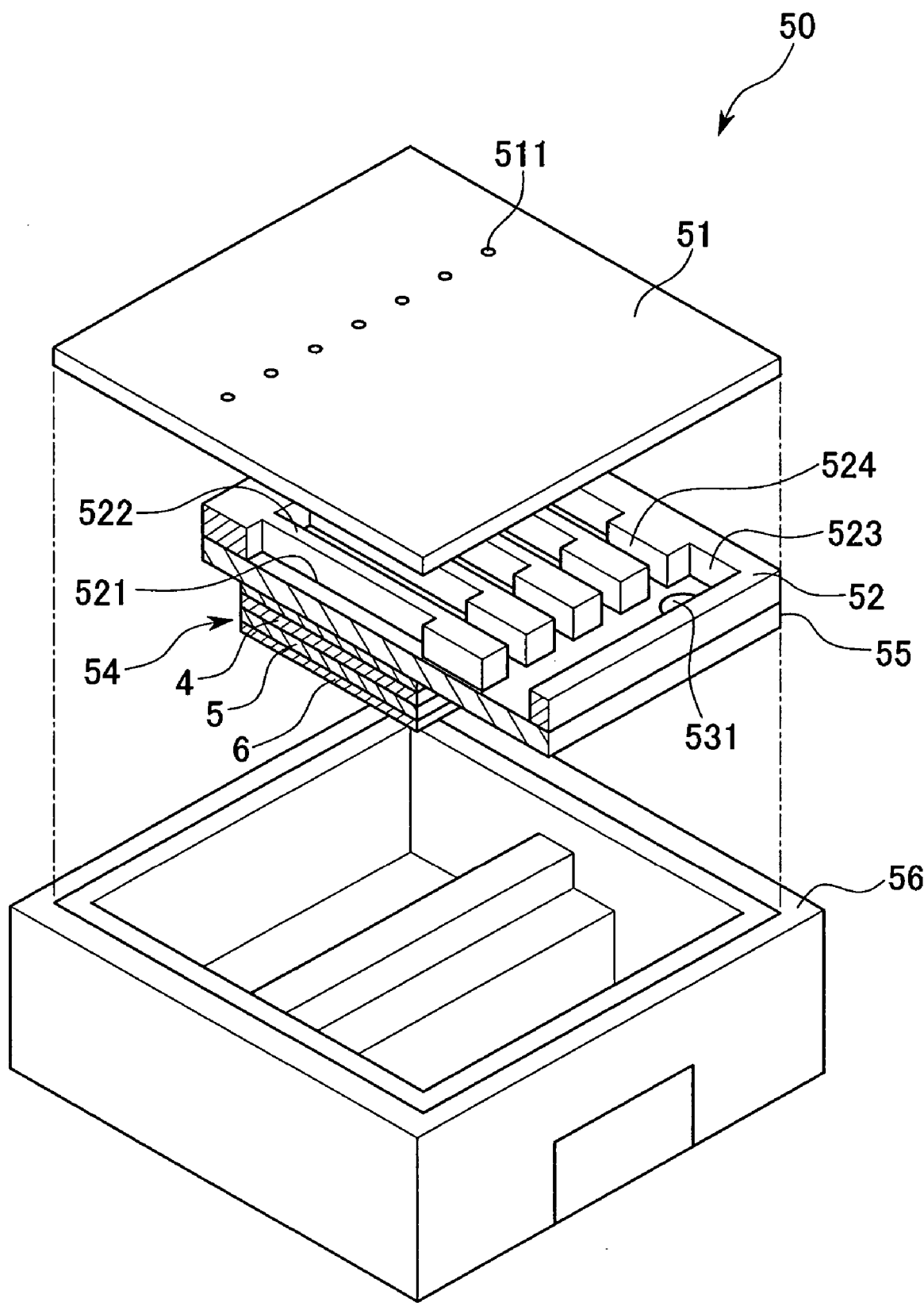
FIG. 6 is an exploded perspective view of the ink jet recording head.

Next, an ink jet recording head having a piezoelectric element, which is shown in FIG. 1 will be described. FIG. 5 is a side cross-section view illustrating a simple overview of the ink jet recording head having the piezoelectric element which is shown in FIG. 1, and FIG. 6 is an exploded perspective view illustrating this ink jet recording head. It should be noted that the ink jet recording head in FIG. 6 is shown upside down. Reference numeral 50 in these figures is an ink jet recording head (hereinafter, referred to simply as a head). As shown in FIG. 5, the head 50 includes a head body 57 and a piezoelectric element 54 formed thereon. The piezoelectric element 54 shown in FIG. 5 includes the lower electrode 4, the piezoelectric material film 5, and the upper electrode 6 (see FIG. 6), which are shown in FIG. 1, and the buffer layer 3 on which these are formed corresponds to an elastic plate 55 shown in FIG. 5. The base substance 2 constitutes a main portion of the head body 57.

As shown in FIG. 6, the head 50 includes a nozzle plate 51, an ink chamber substrate 52, an elastic plate 55, and piezoelectric elements (vibrating sources) 54 connected to the elastic plate 55, all of which are disposed in a base or base substance 56. This head 50 is an on-demand type piezo-jet head.

The nozzle plate 51 is constituted by, e.g., a rolled plate made of stainless steel, and a plurality of nozzle holes 511 for ejecting ink droplets are formed in a line in the nozzle plate 51. The pitch between adjacent nozzle holes 511 is set based on the desired printing precision.

The ink chamber substrate 52 is fixedly attached to the nozzle plate 51. The ink chamber substrate 52 is made of the above-mentioned Si substrate (base substance 2) and includes a plurality of cavities (ink cavities) 521, a reservoir 523 for temporarily storing the ink supplied from an ink cartridge 631, and a plurality of supplying channels 524 for supplying the ink from the reservoir chamber 523 into the ink chambers 521, which are defined by the nozzle plate 51, sidewalls (partitions) 522, and the elastic plate described later.

Each of the cavities 521 is formed in the shape of a rectangle, and its shape in a plane is rectangular (parallelepiped) with the long axis and the short axis, shown in FIGS.

7A and 7B. Representative scales of the long and short axes of the cavity 521 are 2 mm and 60 μm, respectively. These cavities are provided for each of nozzles 511, respectively, as shown in FIGS. 5 and 6. The volume of each cavity 521 is varied due to the vibration of the elastic plate 55, which will be described later, and the ink can be ejected by this change of the volume of each cavity.

As a base for the ink chamber substrate 52, i.e., the above-mentioned base substance, a silicon single crystal substrate with a (110) orientation is used. This silicon single crystal substrate with a (110) orientation is suitable for anisotropic etching and for this reason, the ink chamber substrate 52 can be formed easily and reliably. Moreover, such a silicon single crystal substrate is used so that a surface, on which the buffer layer 3, i.e., the elastic plate 55 is formed, is a (110) surface.

The average thickness of the ink chamber substrate 52, that is the thickness for including the cavities 521, is preferably about 10 to 1000 μm and more preferably about 100 to 500 μm, although it is not particularly limited. The volume of each of the ink chambers 521 is preferably about 0.1 nL to 100 nL, and more preferably about 0.1 nL to 10 nL, although this is not particularly limited.

The elastic plate 55 is attached to the opposite side of the nozzle plate 51 of the ink chamber substrate 52, and a plurality of the piezoelectric elements 54 are attached to the opposite side of the ink chamber substrate 52 of the elastic plate 55. The elastic plate 55 is constituted by the buffer layer 3, i.e., the first buffer layer 7, the second buffer layer 8, and the third buffer layer 9. However, since, in this buffer layer 3, especially the first buffer layer 7 is considerably thicker than the second buffer layer 8 or the third buffer layer 9, the first buffer layer 7 acts substantially as the elastic plate 55.

At a predetermined area of the elastic plate 55 is formed a through hole 531 penetrating the elastic plate 55 in the direction of its thickness. The ink is supplied from an ink cartridge 631, which will be described later, into the reservoir 523 through the hole 531.

Figure 7A:
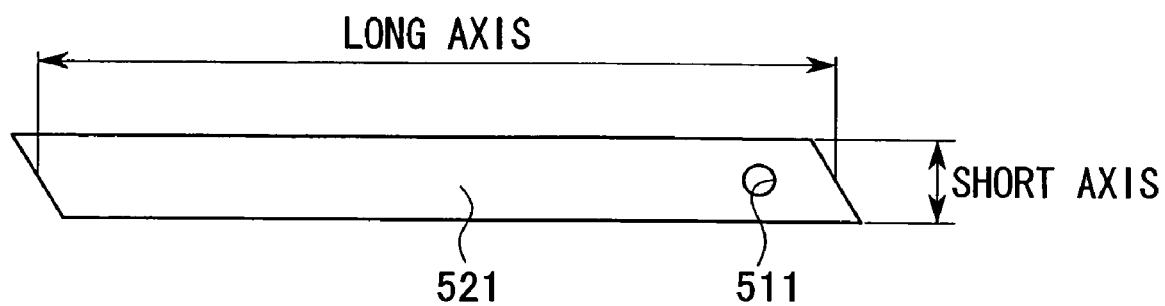
FIGS. 7A and 7B are plan views of the cavity and the piezoelectric element, respectively.
Figure 7B:
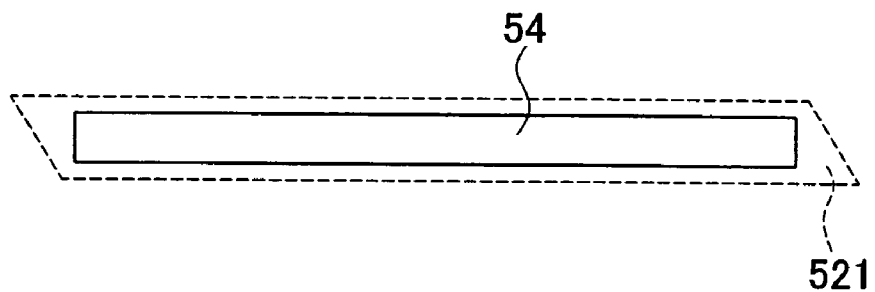

A piezoelectric material layer 5 is disposed between the lower electrode 541 and the upper electrode 542 to form each piezoelectric element 54, and each of the piezoelectric elements 54 is disposed near the center of one of the cavities 521 and is rectangular in top view, as shown in FIGS. 7A and 7B. Each of the piezoelectric elements 54 is electrically connected to a piezoelectric element driving circuit, which will be described later, and operated (vibrated or deformed) based on the signal from the piezoelectric element driving circuit. Each piezoelectric elements 54 serves as the vibrating source (head actuator), and the elastic plate 55 is vibrated (flexed) by the vibration (flexure) of the piezoelectric elements 54 so that the inner pressure in the cavities 521 rises essentially instantaneously. The base 56 is composed of, e.g., various resin materials and various metal materials, and the ink jet chamber substrate 52 is fixed thereto and supported therein.

The elastic plate 55 having such a constitution is not deformed, as shown in FIG. 8A, in the case in which a predetermined ejection signal is not input via the piezoelectric element driving circuit, i.e., that a voltage is not applied between the lower electrode 4 and the upper electrode 6 of the piezoelectric element 54. As a result, the elastic plate 55 is not deformed, and thus the volume of the cavity 521 is not varied. Therefore, no ink droplets are ejected through the nozzle 511.

On the other hand, in the case in which a predetermined ejection signal is input via the piezoelectric element driving circuit, i.e., that a predetermined voltage (e.g., about 30 V) is applied between the lower electrode 4 and the upper electrode 6 of the piezoelectric element 54, the piezoelectric material layer 5 is bent (flexed) along the short axis, as shown in FIG. 8B. As a result, the elastic plate 55 is flexed, e.g., by about 500 nm, and thus the volume of the cavity 521 changes. At this time, the pressure inside the cavity 521 instantly increases, and ink droplets are ejected through the nozzles 511.

That is, when a voltage is applied to the piezoelectric material layer 5, the lattice of the piezoelectric material layer 5 extends along the perpendicular axis to the plane of the layer, and at the same time, shrinks along the parallel axis to the plane. In this condition, a tensile stress is imparted to the piezoelectric material layer 5 in the plane. Therefore, the elastic plate 55 is bent or flexed due to this stress. The larger the displacement value (absolute value) of the piezoelectric material layer 5 along the short axis of the cavity 521, the larger the flexure value of the elastic plate 55, and the ink droplets can be ejected more efficiently. Here, "efficiently" means that the same amount of the ink droplets can be ejected by smaller applied voltage. For this reason, the driving circuit can be simplified and at the same time the power consumption can be reduced, and therefore, the pitch of the nozzles 511 can be set to be smaller, i.e., the high density can be realized. In addition, since the length of the long axis of the cavity 521 can be shortened, the entire head can be made smaller.

Once the ejection of one droplet of ink is completed, the voltage applied between the lower electrode 4 and the upper electrode 6 is interrupted by the piezoelectric element driving circuit. By this, the piezoelectric elements 54 restore their original shapes, as shown in FIG. 8A, and the volume of each cavity 521 increases. At this time, the pressure acting from the ink cartridge 631, which will be described later, to the nozzles 511 (pressure applied in the forward direction) is applied to the ink. As a result, air cannot enter the cavities 521 through the nozzles 511, and an amount of the ink corresponding to the ejected amount of the ink is supplied from the ink cartridge 631 into the cavities 521 via the reservoir 523. In this way, the ejection signals are input in regular sequence to the piezoelectric element 54 at the position at which the droplets of ink are desired to be ejected via the piezoelectric element driving circuit, and any optional (desired) letters or figures can be printed.

In order to manufacture the head 50 having such a constitution, first, a basic material for the ink chamber substrate 52, i.e., the base substance 2 made of the single crystal silicon substrate (Si substrate) with a (110) orientation described above, is prepared. Then, as shown in FIGS. 3A to 3C and 4A to 4C, the buffer layer 3 (the first buffer layer 7, the second buffer layer 8, and the third buffer layer 9) is formed on the base substance 2, and the lower electrode 4, the piezoelectric material film 5, and the upper electrode 6 are sequentially formed. The buffer layer 3 corresponds to the elastic plate 55, as described above.

Next, patterning of the upper electrode 6, the piezoelectric material film 5, and the lower electrode 4 are performed corresponding with each cavity 521 formed shown in FIG. 7B, and the same number of the piezoelectric elements 54 as that of the cavity 521 are formed, as shown in FIG. 5.

Then, the basic material (the base substance 2) for the ink chamber substrate 52 is processed (patterned), a depressed portion constituting the cavity 521 is formed at the position of each piezoelectric element 54, and the reservoir 523 and a depressed portion constituting the supplying channel 524 is formed at each predetermined position.

Specifically, a mask layer is formed correspondingly with the position where the cavities 521, the reservoir chamber 523, and the supplying channels 524 are to be formed. After that, a dry etching, such as a parallel-plate type reactive ion etching, an inductive coupling etching, an electron cyclotron resonance etching, a helicon wave exciting etching, a magnetron etching, a plasma etching, an ion beam etching, or a wet etching with highly concentrated alkali aqueous solution, such as 5 to 40 wt % of potassium hydroxide or tetramethylammonium hydroxide is performed on the mask layer.

In this example, since a silicon substrate with a (110) orientation is used as the base (base substance 2), a wet etching (anisotropic etching) using the highly concentrated alkali aqueous solution is preferably adopted. On the wet etching (anisotropic etching) using the highly concentrated alkali aqueous solution, since the first buffer layer 7 in the buffer layer 3 acts as a etching stopper as described above, the ink chamber substrate 52 can be formed easily.

By etching and removing the base (base substance 2) until the elastic plate 55 (buffer layer 3) is exposed in the thickness direction, the ink chamber substrate 52 is formed. Remaining portions, which are not etched, constitute the sidewalls 522, and the exposed buffer layer 3 (elastic plate 55) is ready to serve as the elastic plate 55.

The nozzle plate 51 having a plurality of the nozzle 511 formed therethrough is joined in such a manner that each nozzle 511 is positioned (aligned) correspondingly with each depressed portion (cavity 521). As a result, a plurality of the cavities 521, the reservoir 523, and a plurality of the supplying channels 524 are formed. On the joint of the nozzle plate 51, various bonding methods, such as adhesion by adhesives, or various fusion bonding methods can be employed. The cavity substrate 52 is then attached to the base 56, and the ink jet recording head 50 is obtained.

The ink jet recording head 50 obtained by these steps includes the piezoelectric elements 54 with the good piezoelectric characteristic, as described above, and therefore, ejecting of the ink is preferable, and it is environmentally preferable because it does not include Pb. Additionally, since the piezoelectric elements 54 and the elastic plates 55 (buffer layer 3) can be directly formed on the silicon substrate (base substance 2) constituting the ink chamber substrate 52, these can be manufactured or formed by thin film processes, and therefore the high performance and the miniaturization of the entire head can be realized due to the high-densification of the nozzles 511 and the like.

Next, an ink jet printer having the ink jet recording head 50 described above will be described. Here, an ink jet printer in the present invention includes a liquid droplet ejecting device industrially used, as well as a device which prints on papers and the like.

Figure 9:
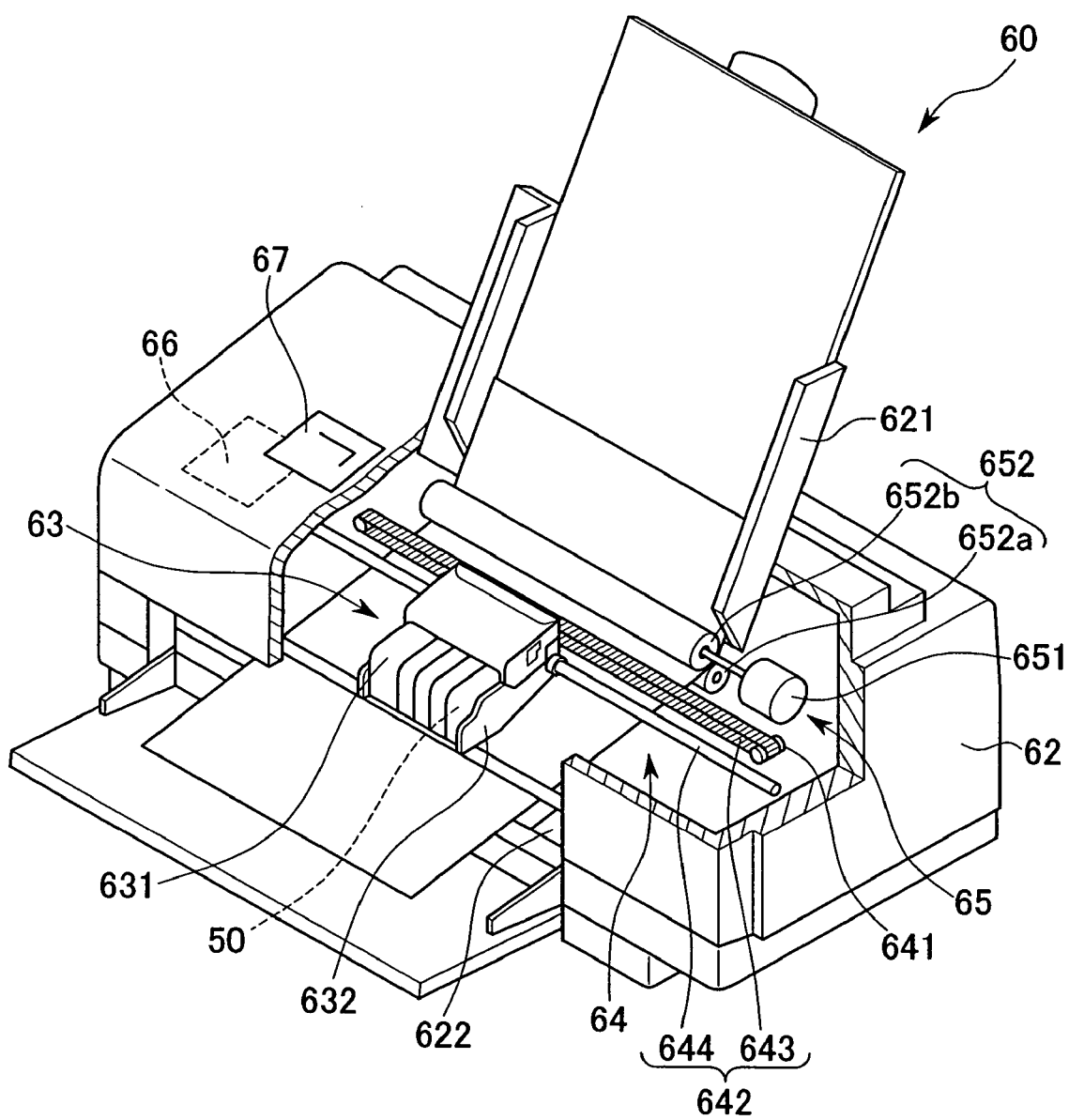
FIG. 9 is a schematic illustration of the ink jet printer of the present invention.

FIG. 9 is a schematic illustration showing a preferred embodiment of an ink jet printer according to the present invention, which applies to a usual printer which prints on papers and the like, and reference numeral 600 in the figure indicates the ink jet printer. In the following description, the upper side of FIG. 9 is referred to as the upper part, and the lower side as the lower part.

The ink jet printer 60 includes a printer body 62, a tray 621 disposed at the upper rear part of the printer body 62 for supplying printing papers P, a paper discharging section 622 formed at the lower front part of the printer body 62 for discharging the printing papers P, and a control panel 67 provided on the printer body 62.

The control panel 67 may consists of, e.g., a liquid crystal display, an organic EL display, or a LED lamp, and includes a display part (not shown) for displaying e.g., error messages and a control part (not shown) including e.g., various kinds of switches.

In the printer body 62 are mounted a printing unit 64 having a reciprocating head unit 63, a feeder (feeding unit) 65 for feeding the printing papers P sheet by sheet to the printing unit 64, and a controller 66 for controlling the printing apparatus 64 and the feeder 65.

By control of the controller 66, the feeder 65 intermittently feeds the printing papers P sheet by sheet. The printing papers P fed intermittently pass near the lower part of the head unit 63. At this time, the head unit 63 is reciprocated perpendicularly to the direction of feeding the printing papers P so that the printing operation is carried out on the printing papers P. That is, the reciprocating motion of the head unit 63 and the intermittent feeding of the printing papers P correspond to a main-scanning and a sub-scanning in the printing process, respectively, and in this way, the ink-jet printing operation is performed.

The printing unit 64 includes the head unit 63, a carriage motor 641 for driving the head unit 63, and a reciprocating mechanism 642 for moving the head unit 63 when the carriage motor 641 is rotated.

The head unit 63 includes an ink jet recording head 50 having a plurality of nozzles 511 formed at the lower part thereof, an ink cartridge 631 for supplying ink to the ink jet recording head 50, and a carriage 632 for holding the ink jet recording head 50 and the ink cartridge 631.

If the ink cartridge 631 contains four colors of ink, e.g., yellow, cyan, magenta, and black, a full color printing can be carried out. In this case, a plurality of ink jet recording heads 50 for providing the colors are mounted in the head unit 63.

The reciprocating mechanism 642 includes a carriage guide shaft 643 having both ends supported by a frame (not shown), and a timing belt 644 extending in parallel with the carriage guide shaft 643.

The carriage 632 is supported by the carriage guide shaft 643 in such a way that the carriage 632 can be reciprocated and is fixedly attached to a part of the timing belt 644.

When the timing belt 644 travels in the forward and reverse directions via a pulley by the operation of the carriage motor 641, the head unit 63 is reciprocated while being guided by the carriage guide shaft 643. During this reciprocation of the head unit 63, a suitable amount of the ink is ejected from the ink jet recording head 50 so that the printing is performed on the printing papers P.

The feeder 65 includes a feeding motor 651 and a feeding roller 652 rotated by the operation of the feeding motor 651.

The feeding roller 652 includes a driven roller 652a and a driving roller 652b, which are disposed opposite to each other through the intervention of a feeding passage of the printing papers P, and the driving roller 652b is connected to the feeding motor 651. Consequently, the feeding roller 652 can feed a number of the printing papers P put in the tray 621 sheet by sheet toward the printing unit 64. Instead of the tray 621, a feeding cassette for storing the printing papers P may be mounted detachably.

The controller 66 controls the printing unit 64 and the feeder 65 based on information inputted from a host computer, such as a personal computer or a digital camera, to carry out the printing operation.

The controller 66 includes a memory for storing control programs mainly for controlling parts of the printer, a piezoelectric element driving circuit for controlling timing of ink ejection by driving the piezoelectric elements (vibrating sources) 54, a driving circuit for driving the printing unit (carriage motor 641), a driving circuit for driving the feeder 65 (the feeding motor 651), a communicating circuit for receiving printing data from the host computer, and a CPU electrically connected to the above components for controlling them, none of which are shown.

Various sensors are electrically connected to the CPU for sensing various printing environments, such as residual amount of the ink in the ink cartridge 631, and position, temperature and humidity of the head unit 63, respectively.

The controller 66 receives the printing data via the communicating circuit to input it to the memory. The CPU processes this printing data, and outputs driving signals to each of the driving circuits based on the processed data and the data inputted from the sensors. By means of the driving signals, the piezoelectric elements 54, the printing unit 64 and the feeder 65 are operated, respectively. In this way, desired printing is carried out on the printing paper P.

Since such an ink jet printer 60 includes the ink jet recording head 50, in which ejecting of the ink is preferable and which is environmentally preferable, the ink jet printer 60 itself indicates a preferable ejecting of the ink and is environmentally preferable.

Moreover, the piezoelectric element of the present invention can be various devices, as well as the ink jet recording head 50 and the ink jet printer 60 as described.

Hereinafter, as such the devices, embodiments of a surface acoustic wave element, a frequency filter, an oscillator, an electronic circuit, a thin film piezoelectric resonator, and an electronic apparatus are explained with reference to the figures.

Figure 10:
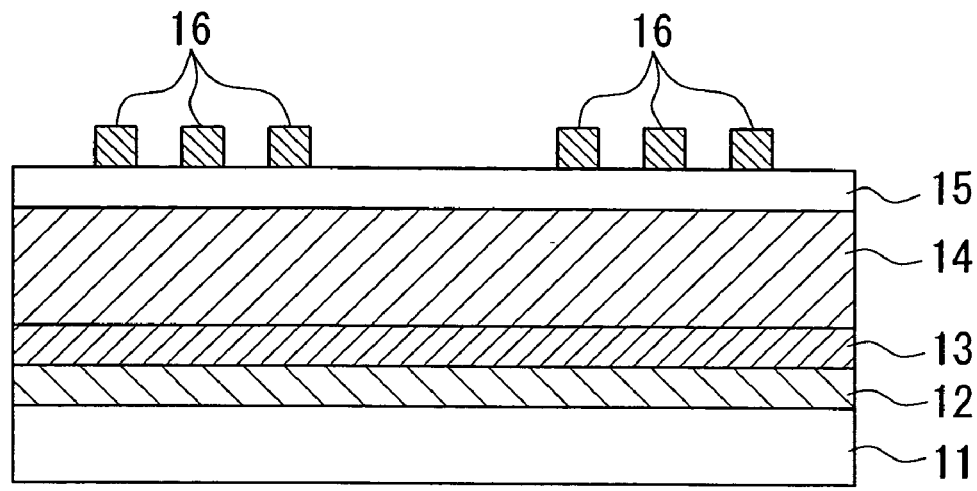
FIG. 10 is a cross-sectional view of the surface acoustic wave element of the present invention.

FIG. 10 shows an embodiment of a surface acoustic wave element including the piezoelectric element of the present invention, e.g., the piezoelectric element having a piezoelectric material film of $BiFeO_3$.

This surface acoustic wave element includes a single crystal silicon substrate 11, a buffer layer 12, a conductive layer 13, a piezoelectric material film 14, a protecting layer 15 made of an oxide or a nitride as a protecting film, and electrodes. The electrodes are inter-digital transducers (hereinafter, referred to as IDT electrodes), and have shapes like e.g., the IDT electrodes 141, 142, 151, 152, and 153 shown in FIGS. 4A to 4C and 5, described later, in a plan view.

In manufacturing the surface acoustic wave element having such a constitution, a silicon substrate with a (111) plane with a natural oxide film thereon is prepared as the single crystal silicon substrate 11. As this single crystal silicon substrate 11, a substrate, in which semiconductor devices such as thin film transistor (TFT) are preliminarily formed, is preferable, and in this case, the surface acoustic wave element obtained is integrated with these semiconductor devices.

Next, the buffer layer 3 in the piezoelectric element 1 shown in FIG. 1 is formed on the single crystal silicon substrate 11, and this is the buffer layer 12. The buffer layer 12 (buffer layer 3) is formed by sequentially forming the first buffer layer 7, the second buffer layer 8, and the third buffer layer 9. The thickness of this buffer layer 12 formed in this way is, e.g., about 1 μm. However, the thickness is not limited thereto.

Next, the lower electrode 4 shown in FIG. 1 is formed on the buffer layer 12, and this is the conductive layer 13.

On the conductive layer 13 is formed the piezoelectric material film 5 of $BiFeO_3$ shown in FIG. 1 which has a rhombohedral structure in a pseudo-cubic system with a (100)-orientation and has a thickness of about 1 μm, and this is the piezoelectric material film 14.

Next, a $SiO_2$ film as a protecting film 15 is formed on the piezoelectric material film 14, e.g., using a laser ablation method. This protecting film 15 protects piezoelectric material film 14 from the atmosphere and prevents it from, e.g., moisture and impurities in the atmosphere, and concurrently controls the temperature characteristic of the piezoelectric material film 14. As long as it has such functions, materials for the protecting film are not limited to $SiO_2$.

Then, for example, an aluminum thin film is formed on the protecting film 15, and by patterning this, the electrodes 16 with a desired shape called an IDT are formed. The surface acoustic wave element shown in FIG. 10 is thereby obtained.

In such a surface acoustic wave element, since the piezoelectric material film 14 is formed through the intervention of the conductive film 13 on the buffer layer 12 made of a crystal film in a pseudo-cubic system with a (100) orientation, the piezoelectric material film 14, which has a rhombohedral structure in a pseudo-cubic system with a (100)-orientation, can grow epitaxially, and therefore, the piezoelectric material film 14 has a high quality and the surface acoustic wave element itself has a high performance.

In addition, since the piezoelectric material film 14 is formed through the intervention of the conductive film 13 on the buffer layer 12, the piezoelectric material film 14 can grow highly oriented even in the case in which the piezoelectric material film 14 cannot grow directly on the buffer layer 12, with an orientation. For this reason, a material having a large electromechanical coupling coefficient can be selected as the piezoelectric material film 14, and thereby the surface acoustic wave element itself has a high performance.

In this embodiment, a $BiFeO_3$ film, which has a rhombohedral structure in a pseudo-cubic system with a (100)-orientation, is formed as the piezoelectric material film 14. However, for example, in the case in which the conductive film 13 has a pseudo-cubic system with a (111)-orientation, a $BiFeO_3$ film, which has a tetragonal structure in a pseudo-cubic system with a (111)-orientation, is formed.

Since the piezoelectric material film 14 having such a constitution, which has a tetragonal structure in a pseudo-cubic system with a (111)-orientation, can grow with high quality, the surface acoustic wave element itself has a high performance.

Additionally, in the case in which a $BiFeO_3$ film, which has a rhombohedral structure in a pseudo-cubic system with a (100)-orientation, is grown epitaxially, and in the case in which a $BiFeO_3$ film, which has a tetragonal structure in a pseudo-cubic system with a (111)-orientation, is grown with an orientation, the piezoelectric material film 14 may be formed directly on the buffer layer 12 without the the conductive film 13. Also, in this case, since the piezoelectric material film 14 can grow with high quality, the surface acoustic wave element itself has a high performance.

Figure 11:
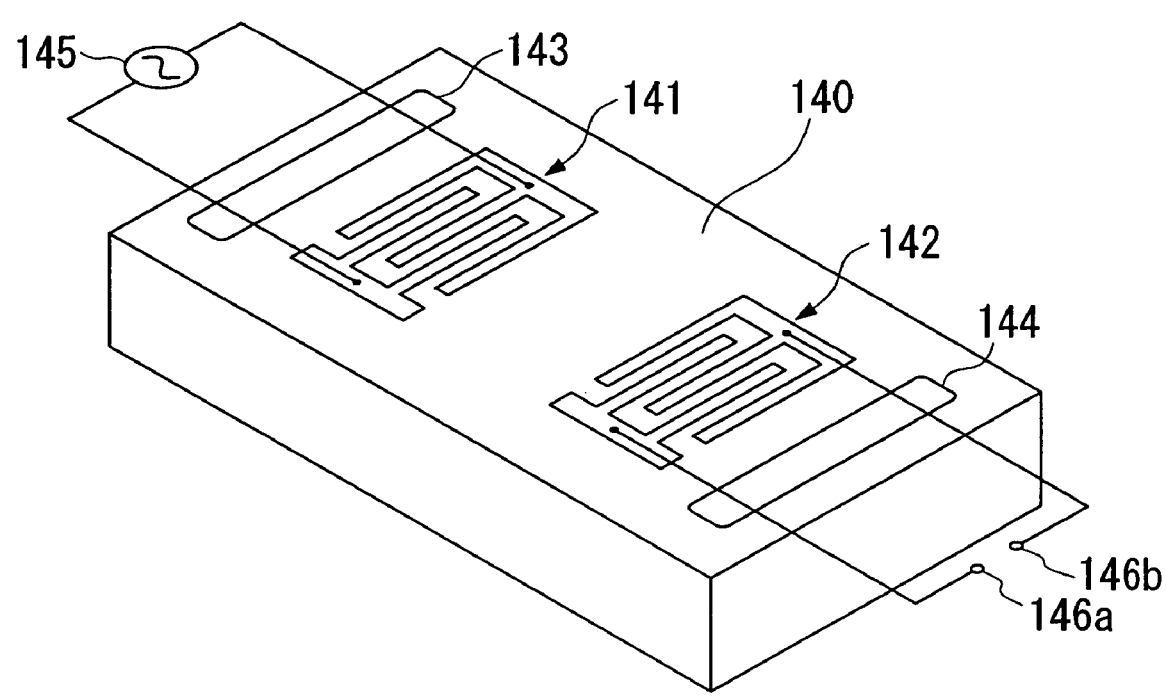
FIG. 11 is a cross-sectional view of the frequency filter of the present invention.

FIG. 11 shows an embodiment of the frequency filter of the present invention. The frequency filter shown in FIG. 11 has a substrate 140. As this substrate 140, e.g., the substrate in which the surface acoustic wave element, as shown in FIG. 10, is used. That is, the substrate 140 is a substrate formed by depositing in sequence the buffer layer 12, the conductive film 13, the piezoelectric material film 14, the protecting layer 15 on the single crystal substrate 11.

IDT electrode 141 and IDT electrode 142 are formed on the surface of the substrate 140. The IDT electrodes 141 and 142 are formed, for example, from Al or an Al alloy, and the thickness of the IDT electrodes 141 and 142 is set to about 1/100 of the pitch of the IDT electrodes 141 and 142. In addition, sound absorbing parts 143 and 144 are formed on the surface of the substrate 140 so as to sandwich the IDT electrodes 141 and 142. The sound absorbing parts 143 and 144 absorb the surface acoustic waves that propagate along the surface of the substrate 140. A high frequency signal source 145 is connected to the IDT substrate 141 formed on the substrate 140, and a signal line is connected to the IDT electrode 142.

In the structure described above, when the high frequency signal is output from the high frequency signal source 145, the frequency signal is applied to the IDT electrode 141, and a surface acoustic wave is generated on the surface of the substrate 140. This surface acoustic wave propagates along the surface of the substrate 140 at a velocity of about 5,000 m/s. The surface acoustic wave that has propagated from the IDT electrode 141 towards the sound absorbing part 143 side is absorbed by the sound absorbing part 143, but among the surface acoustic waves that have propagated towards the IDT terminal 142 side, a surface acoustic wave having a particular frequency determined, for example, depending on the pitch of the IDT electrode 142, or having a frequency in a particular band, is converted into an electric signal. This surface acoustic wave is extracted by the terminals 146a and 146b via the signal line. Moreover, most of the frequency components having the particular frequency or a frequency in a particular band pass through the IDT electrode 142 and are absorbed by the sound absorbing part 144. In this manner, among the electric signals supplied to the IDT electrode 141 provided with the frequency filter of the present embodiment, it is possible to obtain only a surface acoustic wave having a particular frequency or having a frequency in a particular band (filtering).

Figure 12:
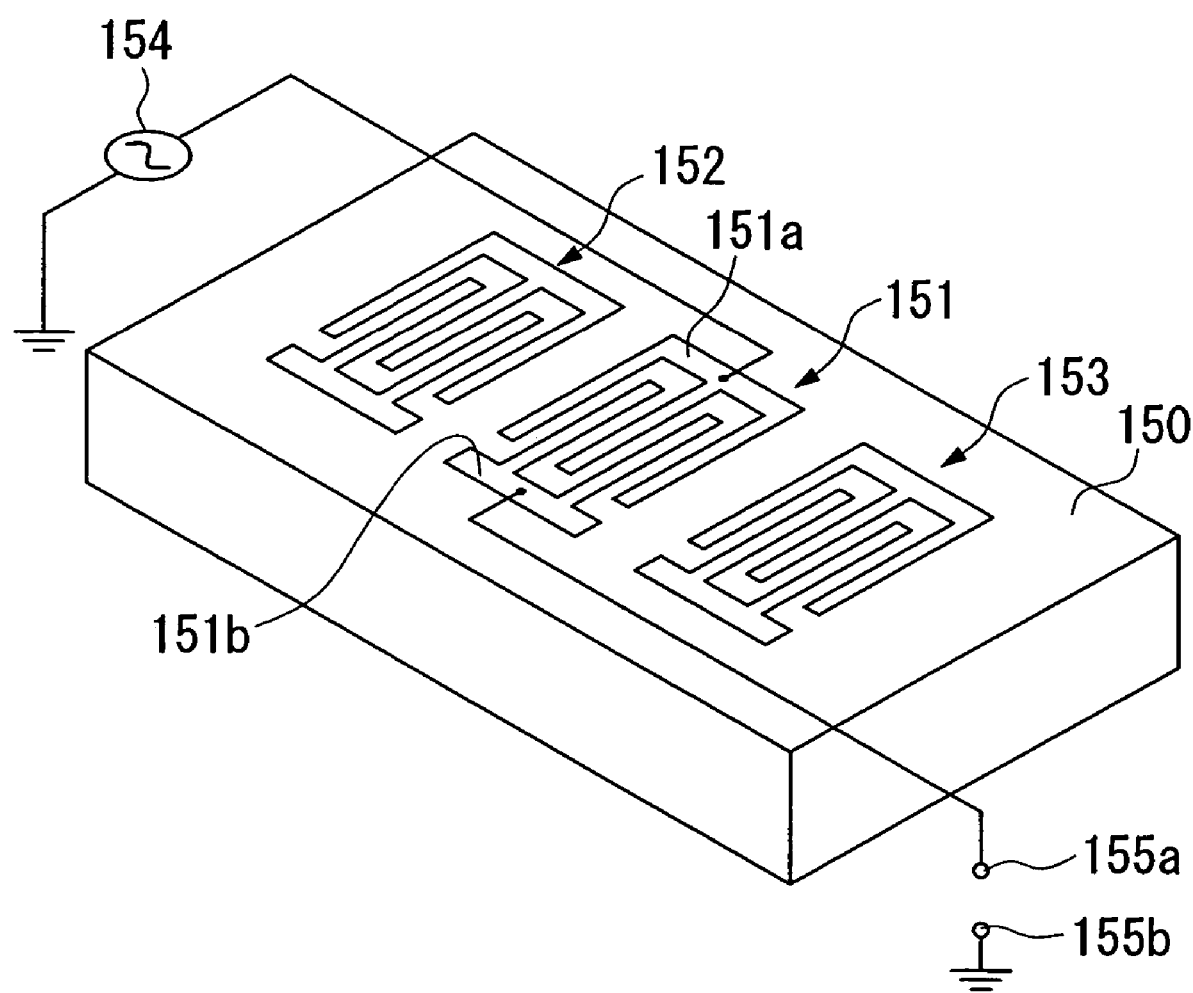
FIG. 12 is a perspective view of the oscillator of the present invention.

FIG. 12 shows an embodiment of the oscillator of the present invention. The filter shown in FIG. 12 has a substrate 150. As this substrate 150, in the same way as in the frequency filter described above, e.g., the substrate in which the surface acoustic wave element, as shown in FIG. 10, is used. That is, the substrate 150 is a substrate formed by depositing in order the buffer layer 12, the conductive film 13, the piezoelectric material film 14, and the protecting layer 15 on the single crystal substrate 11.

On the surface of the substrate 150, an IDT electrode 151 is formed, and then IDT electrodes 152 and 153 are formed so as to sandwich the IDT electrode 151. The IDT electrodes 151 to 153 are formed, for example, from Al or an Al alloy, and the respective thickness of the IDE electrodes 151 to 153 is set to about 1/100 of each of the pitches of the IDT electrodes 151 to 153. In addition, the high frequency signal source 154 is connected to one of the interdigital electrodes 151a, which forms the IDT electrode 151, and the other interdigital electrode 151b is connected to the signal line. Moreover, the IDT electrode 151 corresponds to an electrode for applying electric signals, and the IDT terminals 152 and 153 correspond to what is termed a resonance electrode in this invention, which causes resonance at a particular frequency component or a frequency component of a particular band of the surface acoustic wave generated by the IDT electrode 51.

In the structure described above, when a high frequency signal is output from the high frequency signal source 154, the frequency signal is applied to the interdigital electrode 151a of the IDT electrode 151, and on surface of the substrate 150, a surface acoustic wave is generated that propagates on the IDT electrode 152 side and a surface acoustic wave is generated that propagates on the IDT electrode 153 side. The velocity of the surface acoustic waves is about 5,000 m/s. A surface acoustic wave having a particular frequency component among these surface acoustic waves is reflected at the IDT electrode 152 and the IDT electrode 153, and thereby a standing wave is generated between the IDT electrode 152 and the IDT electrode 153. The surface acoustic wave having this particular frequency component is repeatedly reflected at the IDT terminals 152 and 153, and thereby the particular frequency component or the frequency component having a particular band resonates, and the amplitude increases. A part of the surface acoustic wave having this particular frequency component or the frequency component having a particular band is extracted from the other interdigital electrode 151b of the IDT electrode 151, and an electric signal having a frequency depending on the resonance frequency (or a frequency having a band of a certain degree) of the IDT electrode 152 and the IDT electrode 153 can be extracted at the terminal 155a and the terminal 155b.

Figure 13A:
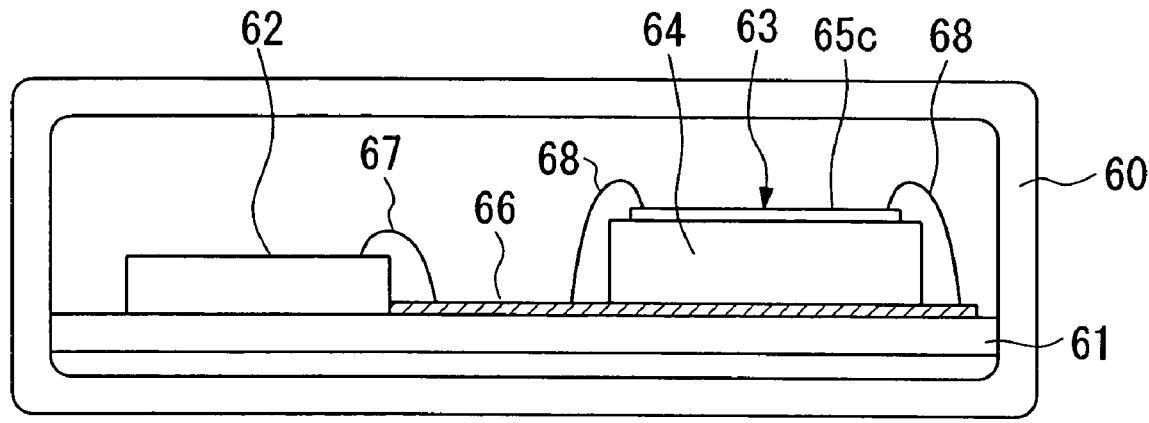
FIGS. 13A and 13B are schematic illustrations of an application for VCSO.
Figure 13B:
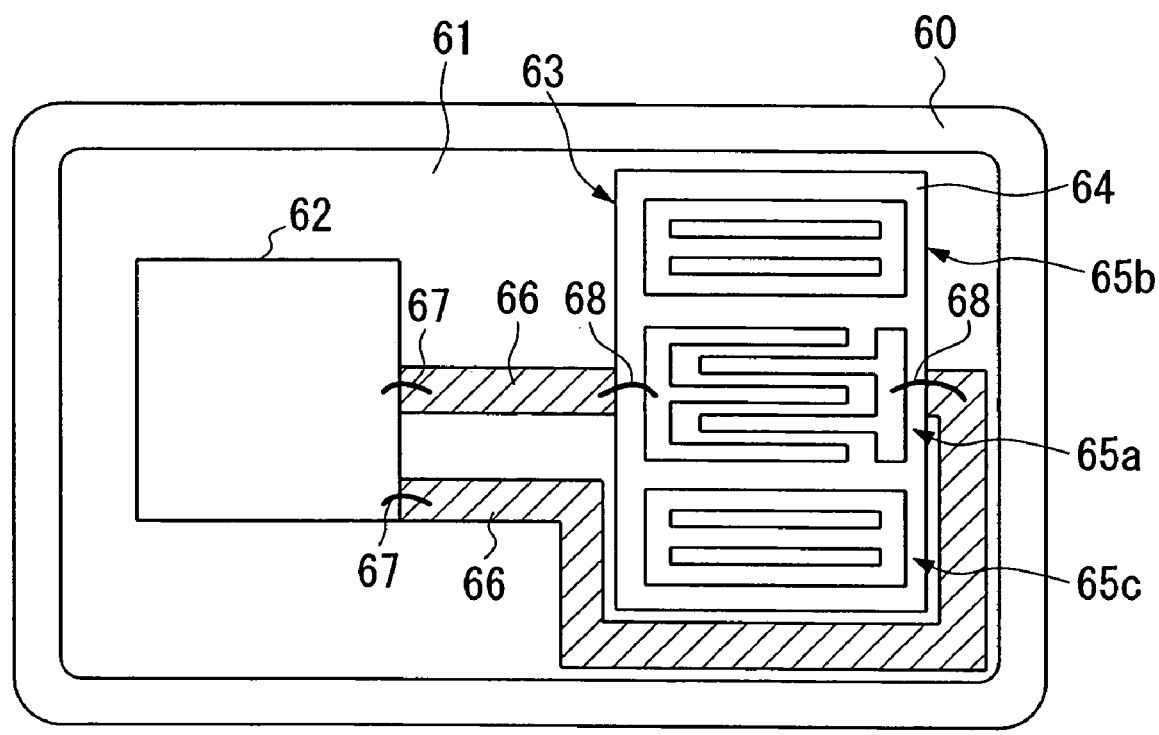

FIGS. 13A and 13B are figures showing an example in which the oscillator (surface acoustic wave element) of the present invention is applied to a VCSO (Voltage Controlled SAW Oscillator), where 13A is a side perspective view and 13B is a top perspective view. The VCSO is mounted inside a case 60 made of metal (aluminum and stainless steel). The IC (integrated circuit) 62 and the oscillator 63 are mounted on a substrate 61. The IC 62 is an oscillating circuit which controls the frequency applied to the oscillator 63 depending on the voltage value input from an external circuit (not illustrated).

The oscillator 63 has the IDT electrodes 65a to 65c formed on the substrate 64 thereof, and this structure is substantially identical to the oscillator shown in FIGS. 13A and 13B. As this substrate 64, in the same way as in the previous embodiment described above, e.g., the substrate in which the surface acoustic wave element, as shown in FIG. 10, is used.

Wirings 66 are patterned on the substrate 61 in order to electrically connect the IC 62 and the oscillator 63. The IC 62 and the wirings 66 are connected by, for example, a wire line 67, such as a metal wire, the oscillator 63 and the wirings 66 are connected by a wire line 68 made, for example, of a metal wire, and thereby the IC 62 and the oscillator 63 are electrically connected via the wirings 66.

The VCSO can be integrated with the IC 62 and the oscillator 63 on the same substrate.

Figure 14:
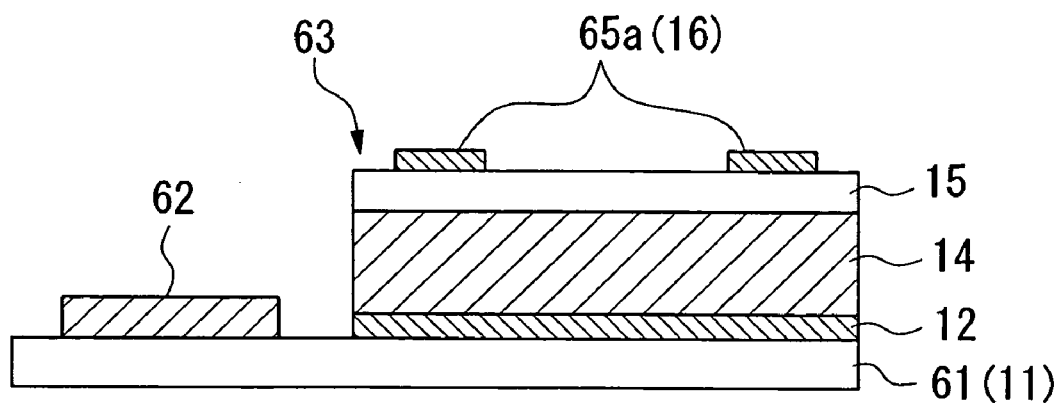
FIG. 14 is a schematic illustration of an application for VCSO.

FIG. 14 is a schematic illustration of the VCSO integrated with the IC 62 and the oscillator 63. The oscillator 63 in FIG. 14 has a constitution in which the conductive film 13 is not used in the surface acoustic wave element shown in FIG. 10.

In FIG. 14, the VCSO has a constitution in which the IC 62 and the oscillator 63 are formed on the common single crystal silicon substrate 61 (11). The IC 62 is electrically connected to the electrodes 65a (15), not shown in the figure. In this embodiment, a TFT (thin film transistor) is adopted as a transistor which constitutes the IC 62.

Since a TFT is adopted as a transistor which constitutes the IC 62 in this embodiment, the oscillator (the surface acoustic wave element) 63 is formed on the single crystal silicon substrate 61, and a TTF, which is formed on a different substrate from the single crystal silicon substrate 61, is transferred to the single crystal silicon substrate 61, thereby the TTF and the oscillator 63 can be integrated. For this reason, even in the case in which a substrate material on which a TTF cannot be formed directly or a substrate material which is not suitable for a TTF to be formed, the TTF can be preferably formed by the transfer. Various transfer methods can be adopted, but the transfer method, which is described in Japanese Unexamined Patent Application, First Publication No. Hei 11-26733, can be preferably adopted.

Figure 15:
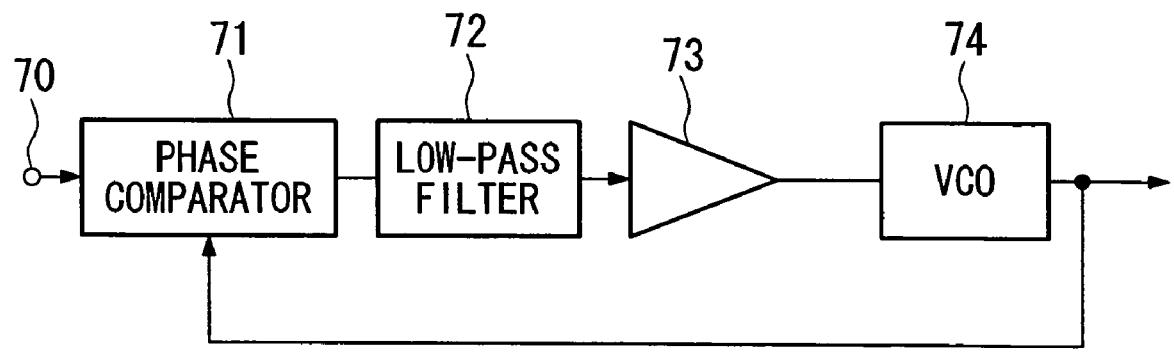
FIG. 15 is a block diagram showing a PLL circuit of an embodiment of the present invention.

The VCSO shown in FIG. 14 is used, e.g., as a VCO (Voltage Controlled Oscillator) for the PLL circuit shown in FIG. 15. Here, the PPL circuit will be simply explained.

FIG. 15 is a block diagram showing the basic structure of the PPL circuit, and as shown in FIG. 15, the PPL circuit is constituted by a phase comparator 71, a low-pass filter 72, an amplifier 73, and a VCO 74.

The phase comparator 71 compares the phases (or frequencies) of the signals input from the input terminal 70 with the output signal of the VCO 74, and outputs an error voltage signal whose value is set depending on the difference therebetween. The low-pass filter 72 allows only the low frequency component of the error electric signal output from the phase comparator 71 to pass, and the amplifier 73 amplifies the signal output from the reduction filter 72. The VCO 74 is an oscillating circuit in which the oscillating frequency varies continuously within a range that depends on the input voltage value.

The PPL circuit having such a constitution acts such that the difference between the phases (or frequencies) input from the input terminal 70 is reduced, and the frequency of the signal output from the VCO 74 is synchronized with the frequency of the signal input from the input terminal 70. When the frequency of the signal output from the VCO 74 is synchronized with the frequency of the signal input from the input terminal 70, subsequently, a signal is output so as to match the signal input from the input terminal by excluding a certain phase difference or so as to follow the variation in the input signal.

Figure 16:
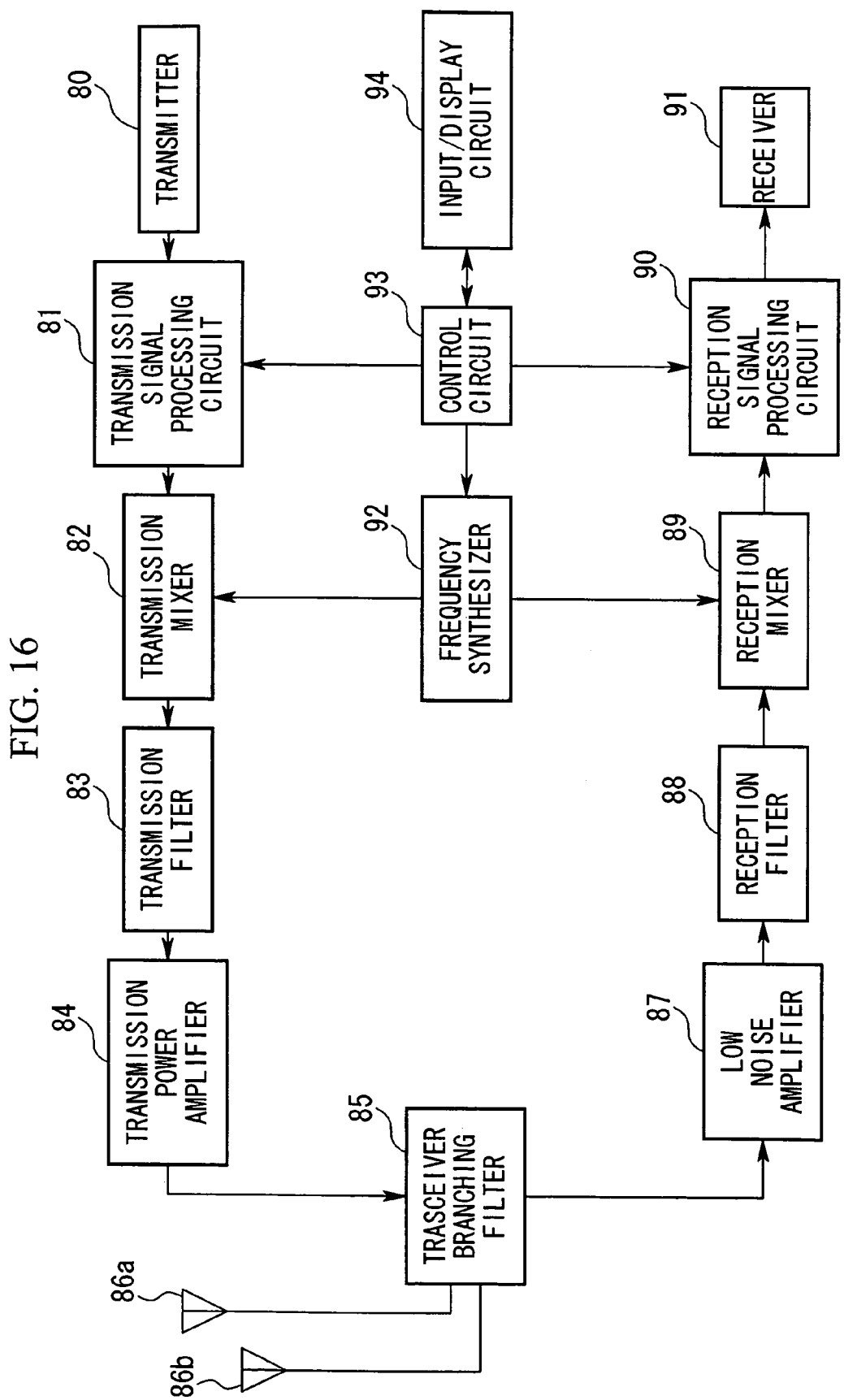
FIG. 16 is a block diagram showing an electronic circuit of an embodiment of the present invention.

FIG. 16 is a block diagram showing the electrical constitution according to an embodiment of the electronic circuit of the present invention. Moreover, the electronic circuit shown in FIG. 16 is a circuit provided inside a mobile phone 100 shown in FIG. 17. The mobile phone 100 as an example of the mobile phone of the present invention shown in FIG. 17 provides an antenna 101, a receiver 102, transmitter 103, a liquid crystal display 104, and control keys 105.

The electronic circuit shown in FIG. 16 has the basic constitution of the electronic circuit provided in the mobile phone 100, and is formed by a transmitter 80, a transmission signal processing circuit 81, a transmission mixer 82, a transmission filter 83, a transmission power amplifier 84, a transceiver branching filter 85, antennas 86a and 86b, a low noise amplifier 87, a reception filter 88, a reception mixer 89, a reception signal processing circuit 90, a receiver 91, a frequency synthesizer 92, a control circuit 93, and an input/display circuit 94. The mobile phone presently in practical use is more complicated because the mobile phone carries out the frequency conversion processing a plurality of times.

Figure 17:
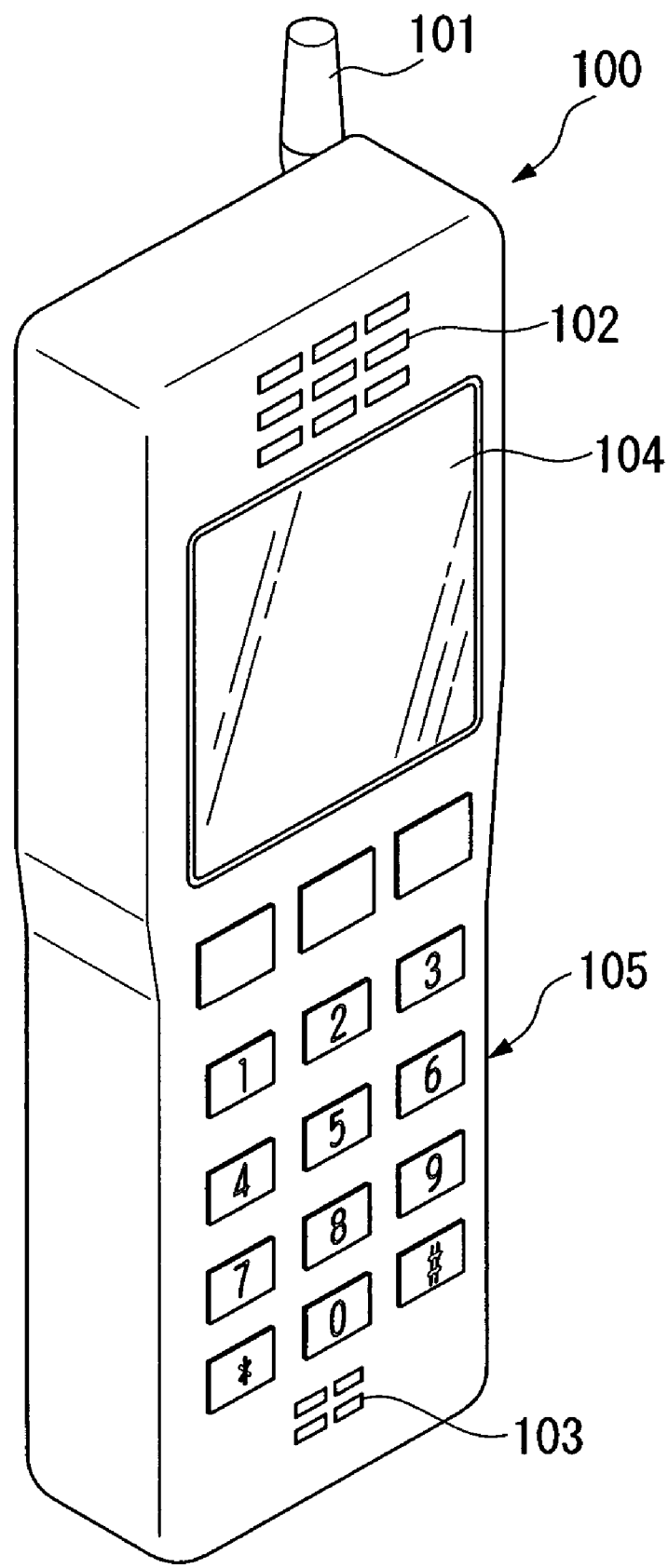
FIG. 17 is a perspective view of a mobile phone of an embodiment of the present invention.

The receiver 80 is realized, for example, by a microphone that converts sound signals to electrical signals, and corresponds to the transmitter 103 in the mobile phone 100 in FIG. 17. The transmission signal processing unit 81 is a circuit that implements, for example, D/A conversion processing, modulation processing, and the like on the electric signal output from the transmitter 80. In the transmission mixer 82, the signal output from the transmission signal processing circuit 81 is mixed using the signal output from the frequency mixer 92. Moreover, the frequency of the signal supplied to the transmission mixer 82 is, for example, 380 MHz. The transmission filter 83 allows only the signal having the frequency required among the intermediate frequencies (IF) to pass, and the signals having unnecessary frequencies are cut off. The signal output form the transmission filter 83 is converted to an RF signal by a conversion circuit (not illustrated). The frequency of this RF signal is, for example, about1.9 GHz. The transmission power amplifier 84 amplifies the electric power of the RF signal output from the transmission filter 82, and outputs it to the transceiver branching filter 85.

The transmission branching filter 85 outputs an RF signal output from the transmission power amplifier 84 to the antennas 86a and 86b, and transmits in the form of an electric wave from the antennas 86a and 86b. In addition, the transmission branching filter 85 separates the reception signal received by the antennas 86a and 86b, and outputs these to the low noise amplifier 87. The frequency of the received signals output from the transceiver branching filter 85 is, for example, about 2.1 GHz. The low noise amplifier 87 amplifies the received signals from the transceiver branching filter 85. Moreover, the signal output from the low noise amplifier 87 is converted to an intermediate signal (IF) by a conversion circuit (not illustrated).

The reception filter 88 allows only signals having the required frequency among IF converted by the conversion circuit (not illustrated) to pass, and the signals having unnecessary frequencies are cut off. The reception mixer 89 mixes the signals output from the transmission signal processing circuit 81 using the signal output from the frequency synthesizer 92. Moreover, the intermediate frequency supplied to the reception mixer 89 is, for example, 190 MHz. The reception signal processing circuit 80 is a circuit that implements, for example, A/D conversion processing and demodulation processing of the signal output from the reception mixer 89. The receiver 91 is realized, for example, by a small speaker that converts an electric signal to sound, and corresponds to the receiver 102 in the mobile phone shown in FIG. 17.

The frequency synthesizer 92 is a circuit that generates the signal supplied to the transmission mixer 82 (for example, a frequency of about 380 MHz), and a signal supplied to the reception mixer 89 (for example, a frequency of about 190 MHz). Moreover, the frequency synthesizer provides a PPL circuit that emits an oscillation frequency of, for example, 760 MHz. The signal output from this PPL circuit is divided, a signal having a frequency of 380 MHz is generated and then divided to generate a signal having a frequency of 190 MHz. The control circuit 93 controls the overall operation of the mobile phone by controlling the transmission signal processing circuit 81, the reception signal processing unit 90, the frequency synthesizer 92, and the input/display circuit 94. The input/display circuit 94 is for displaying the state of the device to the user of the mobile phone 100 shown in FIG. 17, and for inputting the instructions of the operator, and corresponds, for example, to the liquid crystal display 104 and the operating keys 105 of the mobile phone 100.

In the electronic circuit having the structure described above, the frequency filter shown in FIG. 11 is used as the transmission filter 83 and the reception filter 88. The filtered frequency (the frequency allowed to pass) is set separately by the transmission filter 83 and the reception filter 88 depending on the required frequency among the signals output from the transmission mixer 82 and the required frequency for the reception mixer 89. In addition, the PPL circuit provided in the frequency synthesizer 92 provides, as the VCO 64 of the PPL circuit shown in FIG. 15, the oscillator shown in FIG. 12 or the oscillator (VCSO) shown in FIGS. 13A to 13B and 14.

Figure 18:
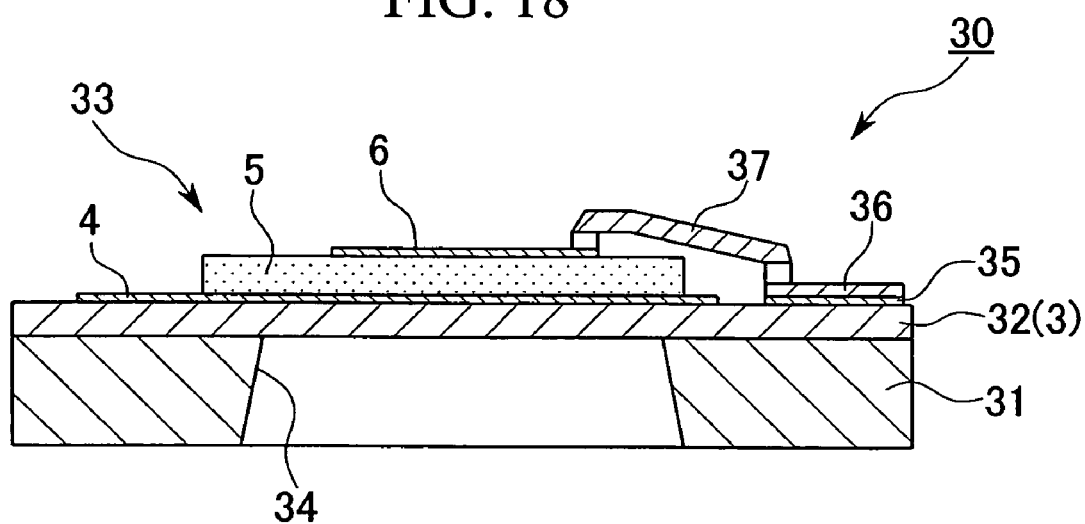
FIG. 18 is a cross-sectional view of the thin film piezoelectric resonator of the present invention.

FIG. 18 shows an embodiment of a thin film piezoelectric resonator of the present invention. Reference numeral 30 in FIG. 18 indicates a diaphragm-type thin film piezoelectric resonator, which is used especially as an element for communication and a filter for communication. In this thin film piezoelectric resonator 30, a resonator 33 is formed on a base substance 31 of a single crystal silicon substrate through the intervention of the elastic plate 32.

The base substance 31 is made of the single crystal silicon substrate with about a thickness of 200 μm and with a (110)-orientation, and on the bottom side (the opposite side to the resonator 32), a via hole 34 is formed through the base substance 31 from the upper side to the bottom side.

The elastic plate 32 is formed of the buffer layer 3 in the piezoelectric element 1 shown in FIG. 1 in this embodiment, and which is formed on a (110) surface of the base substance 31. The resonator 33 is formed of the lower electrode 4, the piezoelectric material film 5, and the upper electrode 6, as shown in FIG. 1. The thin film piezoelectric resonator 30 having such a constitution is constituted by a main part of the piezoelectric element 1 (a part without the base substance 2) shown in FIG. 1 on the base substance 31.

The buffer layer 3 constituting the elastic plate 32 is formed on the first buffer layer 7, the second buffer layer 8, and the third buffer layer 9, as described above. The first buffer layer 7 is grown epitaxially using the ion beam assist method, and thereby the layer 7 is formed directly on the base substance 31.

The elastic plate 32 may be a laminated film, e.g., of a silicon nitride film, a silicon dioxide film, and the buffer layer 3, that is, where a silicon nitride (SiN) with a thickness of 200 nm is formed on the base substance 31, a silicon dioxide ($SiO_2$) with a thickness of 400 nm is formed on the SiN film, the buffer layer 3 is formed on the $SiO_2$ film.

The lower electrode 4 is made of a metal oxide with a perovskite structure which is grown epitaxially in a pseudo cubic system with a (100)-orientation, described above, and in this embodiment, which is made of $SrRuO_3$. However, the thickness is greater, i.e., about 200 nm in this embodiment.

The piezoelectric material film 5 is formed on the (100) surface of a metal oxide with a perovskite structure, $SrRuO_3$, in a pseudo cubic system with a (100)-orientation and is made of $BiFeO_3$ with a rhombohedral structure in a pseudo-cubic system with a (100)-orientation. In this embodiment, the thickness is about 0.9 μm.

The upper electrode 6 is made of $SrRuO_3$, and is grown epitaxially in a pseudo cubic system with a (100)-orientation, which is the same as that of the lower electrode 4. However, the thickness is greater, i.e., about 700 nm in this embodiment. The materials of the upper electrode 6 are not restricted to $SrRuO_3$, and Pt, Ir, $IrO_x$ and other known materials for an electrode can be used.

In this upper electrode 6, a wiring 37 made of gold and the like for electrically connecting to the electrode 35 formed on the elastic plate.

In order to manufacture the thin film piezoelectric element having such a constitution, first, a base as a the base substance 31, i.e., the single crystal silicon substrate (Si substrate) with a (110) orientation described above, is prepared. Then, the buffer layer 3 (the first buffer layer 7, the second buffer layer 8, and the third buffer layer 9) is formed on the Si substrate, and the lower electrode 4, the piezoelectric material film 5, and the upper electrode 6 are sequentially formed. In the case in which a laminated film of a silicon nitride film, a silicon dioxide film, and the buffer layer 3, is adopted as the elastic plate 32, the silicon nitride film and the silicon dioxide film is sequentially formed before forming the buffer layer 3. In this case, if the first buffer layer 7 of the buffer layer 3 is formed epitaxially on the silicon dioxide using an ion beam assist method described above, this first buffer layer 7 grows preferably on the silicon dioxide.

Next, the upper electrode 6, the piezoelectric material film 5, and the lower electrode 4 are patterned correspondingly with a via hole 34, respectively, and thereby the resonator is obtained. Especially on the patterning of the lower electrode 4, an electrode 35 is concurrently formed besides the lower electrode 4, as shown in FIG. 18.

Next, by processing (patterning) such as etching the single crystal silicon substrate form its bottom side, the via hole 34 penetrating through the substrate is formed.

After that, pads 36 and wiring 37, which connect the upper electrode 6 and the electrode 35, are formed, and the thin film piezoelectric resonator is obtained.

The thin film piezoelectric resonator 30 obtained in the way described above has an absorption peak at a wavelength in the range of GHz, e.g., 1.4 GHz or 1.8 GHz, and therefore, it becomes a resonator which resonates in the range of high frequency such as GHz. Additionally, since the piezoelectric material film made of $BiFeO_3$ has a large electromechanical coupling coefficient (e.g., $k^2$=5 to 10%) in the thin film piezoelectric resonator 30, and the resonator 30 works preferably despite of the compact size (thin-type). Since the piezoelectric material film in resonator 30 does not include Pb, the thin film piezoelectric resonator 30 is environmentally preferable.

Additionally, since the elastic plate 32 (buffer layer 3) and the resonator 30 can be directly implemented to the base substance 31 (silicon substrate), and therefore the manufacturing thereof can be performed by the thin film processes, and the miniaturization with high densification can be realized.

In this embodiment, while the lower electrode 4 is made of perovskite metal oxide with a (111) orientation, an electrode made of Pt (platinum) can be used instead of the electrode made of perovskite material. Since a Pt film grows with a (111)-orientation regardless of the film formation method, this lower electrode can be easily formed with an orientation on the buffer layer 3, for example, using a rather simpler method such as sputtering. In the case in which the lower electrode 4 is formed of Pt, the buffer layer 3 as an underlayer is not needed. Therefore, in this case, it is preferable that the silicon nitride and the silicon dioxide films be formed on the base substance, and this laminated film be used as the elastic plate 32.

Figure 19:
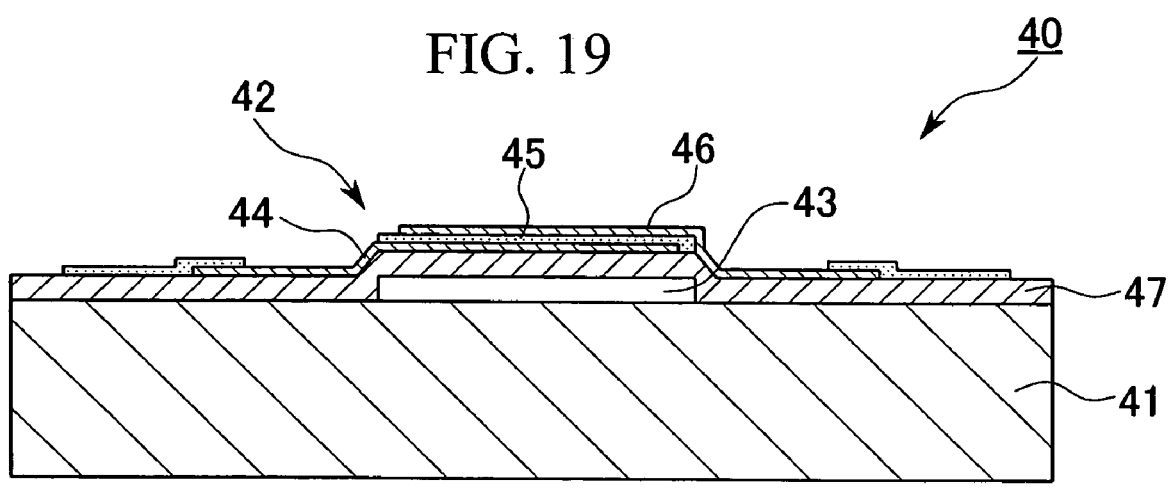
FIG. 19 is a cross-sectional view of the thin film piezoelectric resonator of the present invention.

FIG. 19 shows another embodiment of a thin film piezoelectric resonator of the present invention. Reference numeral 40 in FIG. 19 indicates a thin film piezoelectric resonator. In this thin film piezoelectric resonator 40, a difference from thin film piezoelectric resonator 30 is an air gap 43 formed between a base substance 41 and a resonator 42, instead of the via hole.

In this thin film piezoelectric resonator 40, a resonator 42 is formed on the base substance 41 made of a single crystal silicon substrate with a (110)-orientation. This resonator 42 is formed of the lower electrode 44, the piezoelectric material film 45, and the upper electrode 46 having the same material of the lower electrode 4, the piezoelectric material film 5, and the upper electrode 6, respectively, described above, and especially these lower electrode 44, the piezoelectric material film 45, and the upper electrode 46 are formed above the air gap 43.

In this embodiment, the buffer layer 3 is formed under the lower electrode 44 so that the buffer layer 3 covers the air gap 43, and this buffer layer 3 corresponds to an elastic plate 47, in the same way as the previous example. This elastic plate 47 may also be a laminated film, e.g., of a silicon dioxide film and/or a silicon nitride film, and the buffer layer 3, that is, where a silicon dioxide film and/or a silicon nitride film is formed on the base substance 41, and the buffer layer 3 is formed on these film, in the same way as in the previous example.

In order to manufacture the thin film piezoelectric resonator 40 having such a constitution, first, e.g., germanium (Ge) is formed on the base substance 41 by the deposition and the like, and this is patterned in the same shape of the air gap to be formed, and a sacrifice layer is formed.

Next, the buffer layer 3, i.e., the first buffer layer 7, the second buffer layer 8, and the third buffer layer 9, are sequentially formed covering the sacrifice layer. Before this, the silicon nitride film and the silicon dioxide film, or the silicon dioxide film may be formed. Then, the buffer layer is patterned in a desired shape.

Next, a layer to be the lower electrode 44 covering the buffer layer 3 is formed, and then by patterning this by a dry etching and the like, the lower electrode 44 is formed.

Next, a layer to be the piezoelectric material film 45 covering the lower electrode 44 is formed, and then by patterning this by a dry etching and the like, the piezoelectric material film 45 is formed.

Next, a layer to be the upper electrode 46 covering the piezoelectric material film 45 is formed, and then by patterning this by a dry etching and the like, the upper electrode 46 is formed. Here, by patterning the buffer layer 3, the lower electrode 44, the piezoelectric material film 45 and the upper electrode 46, respectively, on the sacrifice layer, a part of the sacrifice layer is exposed.

After that, by removing the sacrifice layer, e.g., by etching with an oxygenated water, the air gap is formed, and the thin film piezoelectric resonator 40 is obtained.

Also in this embodiment, an electrode made of Pt (platinum) may be used instead of an electrode made of a perovskite material as the lower electrode 44, and silicon nitride and silicon dioxide may be used as an underlayer of the lower electrode 44 instead of the buffer layer 3.

The thin film piezoelectric resonator 40 obtained in the way described above has an absorption peak at a wavelength of, e.g., 2 GHz, and therefore, it becomes a resonator which resonates in a high frequency range such as the GHz range. Additionally, since the piezoelectric material film made of $BiFeO_3$ has a large electromechanical coupling coefficient (e.g., $k^2=5$ to 10%) in the thin film piezoelectric resonator 40, and the resonator 40 works preferably despite of the compact size (thin-type). Since the piezoelectric material film in resonator 30 does not include Pb, the thin film piezoelectric resonator 30 is environmentally preferable.

Additionally, since the elastic plate 47 (buffer layer 3) and the resonator 42 can be directly implemented to the base substance 41(silicon substrate), and therefore the manufacturing thereof can be performed by the thin film processes, miniaturization with high densification can be realized.

If the thin film piezoelectric resonators 30 and 40 are combined accordingly with constitutional elements of circuit, such as an inductor and a condenser, a preferable inductive filter is constituted.

A surface acoustic wave element, a frequency filter, an oscillator, an electronic circuit, a thin film piezoelectric resonator and an electronic apparatus (mobile phone 100), which are embodiments of the present invention, have been explained. However, the present invention is not limited to the embodiments described above, and additions, omissions, substitutions, and other modifications can be made without departing from the spirit or scope of the present invention.

For example, the mobile phone was explained as an example of an electronic apparatus and the electronic circuit disposed in the mobile phone was explained as an example of an electronic circuit in the embodiment described above. However, the present invention is not limited to the mobile phone, and can be applied to various mobile communication devices and electric circuits provided therein.

The invention can be applied not only to mobile telecommunication devices, but to communication devices that are used in a stationary state such as a tuner for receiving BS (Broadcast Satellite) or CS (Commercial Satellite) broadcast and electronic circuits provided therein. In addition, besides a communication device that uses electric waves propagating in the air as a communication carrier, the present invention can also be applied to an electronic device such as a HUB that uses a high frequency signal propagated in a coaxial cable or a light signal propagated in an optical cable, and electronic circuits provided therein.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An ink jet recording head, comprising:
a cavity with a variable internal volume, and
a piezoelectric element having a piezoelectric material film, said variable internal volume changing depending on deformation of said piezoelectric material film, said piezoelectric material film made of $BiFeO_3$ with a rhombohedral structure in a pseudo-cubic system with a (100)-orientation.

2. An ink jet recording head according to claim 1, wherein said piezoelectric material film made of $BiFeO_3$ has a perovskite structure, in which some Fe atoms located at B-sites in the structure are substituted by magnetic metal atoms.

3. An ink jet recording head according to claim 2, wherein said magnetic metal atoms are at least one selected from the group of Mn, Ru, Co, and Ni.

4. An ink jet recording head according to claim 3, wherein said magnetic metal atoms are substituted for 1 to 10% of Fe atoms located at all of said B-sites in said piezoelectric material film made of $BiFeO_3$.

5. An ink jet recording head according to claim 2, wherein said magnetic metal atoms are substituted for 1 to 10% of Fe atoms located at all of said B-sites in said piezoelectric material film made of $BiFeO_3$.

6. An ink jet recording head according to claim 1, wherein said piezoelectric material film made of $BiFeO_3$ has a perovskite structure, in which some Fe atoms located at B-sites are substituted by metal atoms whose valencies are higher than that of Fe.

7. An ink jet recording head according to claim 6, wherein said metal atoms whose valencies are higher than that of Fe are at least one selected from the group of V, Nb, Ta, W, Ti, Zr, and Hf.

8. An ink let recording head according to claim 7, wherein said metal atoms whose valencies are higher than Fe are substituted for 1 to 30% of Fe atoms located at all of the B-sites in said piezoelectric material film made of $BiFeO_3$.

9. An ink jet recording head according to claim 6, wherein said metal atoms whose valencies are higher than Fe are substituted for 1 to 30% of Fe atoms located at all of the B-sites in said piezoelectric material film made of $BiFeO_3$.

10. An ink jet printer comprising an ink jet recording head according to claim 1.

11. An ink jet recording head, comprising:
a cavity with a variable internal volume,
a buffer layer formed on a substrate using an ion beam assist deposition method,
a lower electrode made of a perovskite-type material formed on said buffer layer,
a piezoelectric material film, said variable internal volume changing depending on deformation of said piezoelectric material film, said piezoelectric material film made of $BiFeO_3$ with a rhombohedral structure in a pseudo-cubic system with a (100)-orientation, and
an upper electrode formed on said piezoelectric material film.

12. An ink let recording head according to claim 11, wherein said lower electrode made of a perovskite-type material is epitaxially grown with a (100)-orientation.

13. An ink jet recording head according to claim 11, wherein said electrode made of a perovskite-type material is made of at least one of $SrRuO_3$, Nb—$SrTiO_3$, La—$SrTiO_3$, and $(La, Sr)CoO_3$.

14. An ink jet printer comprising an ink jet recording head according to claim 11.

15. An ink jet recording head, comprising:
a cavity with a variable internal volume, and
a piezoelectric element having a piezoelectric material film, said variable internal volume changing depending on deformation of said piezoelectric material film, said piezoelectric material film made of $BiFeO_3$ with a tetragonal structure in a pseudo-cubic system with a (111)-orientation.

16. An ink jet printer comprising an ink jet recording head according to claim 15.

17. An ink jet recording head, comprising:
a cavity with a variable internal volume,
a buffer layer formed on a substrate,
a lower electrode formed on said buffer layer,
a piezoelectric material film, said variable internal volume changing depending on deformation of said piezoelectric material film, said piezoelectric material film made of $BiFeO_3$ with a tetragonal structure in a pseudo-cubic system with a (111)-orientation, and
an upper electrode formed on said piezoelectric material film.

18. An ink jet recording head according to claim 17, wherein said lower electrode is formed of Pt with a (111)-orientation.

19. An ink jet recording head according to claim 17, wherein said lower electrode has a perovskite structure in a pseudo-cubic system with a (111)-orientation.

20. An ink jet recording head according to claim 19, wherein said lower electrode is made of at least one of $SrRuO_3$, Nb—$SrTiO_3$, La—$SrTiO_3$, and $(La, Sr)CoO_3$.

21. An ink jet printer comprising an ink jet recording head according to claim 17.

22. An ink jet recording head, comprising:
a cavity with a variable internal volume,
a buffer layer formed on a Si substrate,
a lower electrode made of a perovskite-type material formed on said buffer layer,
a piezoelectric material film, said variable internal volume changing depending on deformation of said piezoelectric material film, said piezoelectric material film made of $BiFeO_3$ with a rhombohedral structure in a pseudo-cubic system with a (100)-orientation, and
an upper electrode formed on said piezoelectric material film.

23. An ink jet printer comprising an ink jet recording head according to claim 22.

24. An ink jet recording head, comprising:
a cavity with a variable internal volume,
a buffer layer formed on a Si substrate,
a lower electrode formed on said buffer layer,
a piezoelectric material film, said variable internal volume changing depending on deformation of said piezoelectric material film, said piezoelectric material film made of $BiFeO_3$ with a tetragonal structure in a pseudo-cubic system with a (111)-orientation, and
an upper electrode formed on said piezoelectric material film.

25. An ink jet printer comprising an ink jet recording head according to claim 24.

26. An ink jet recording head, comprising:
a cavity with a variable internal volume;
a Si substrate;
a YSZ layer with a (100)-orientation disposed on said Si substrate;
a $CeO_2$ layer with a (100)-orientation disposed on said YSZ layer;
a $YBa_2Cu_3O_7$ layer with a (001)-orientation disposed on said $CeO_2$ layer;
a $BiFeO_3$ layer with a rhombohedral structure in a pseudo-cubic system with a (100)-orientation disposed on said $YBa_2Cu_3O_7$ layer, said variable internal volume changing depending on deformation of said $BiFeO_3$ layer; and
a $SrRuO_3$ layer with a (100)-orientation disposed on said $BiFeO_3$ layer.

27. An ink jet printer comprising an ink jet recording head according to claim 26.

* * * * *